(12) United States Patent
Soffer

(10) Patent No.: US 10,932,370 B2
(45) Date of Patent: Feb. 23, 2021

(54) METAL SUBLAYER SENSING IN MULTI-LAYER WORKPIECE HOLE DRILLING

(71) Applicant: Drilliant Ltd., Kiryat Ono (IL)

(72) Inventor: Guy Soffer, Kiryat Ono (IL)

(73) Assignee: DRILLIANT LTD, Kiryat Ono (IL)

(*) Notice: Subject to any disclaimer, the term of this patent is extended or adjusted under 35 U.S.C. 154(b) by 186 days.

(21) Appl. No.: 16/022,052

(22) Filed: Jun. 28, 2018

(65) Prior Publication Data
US 2020/0008303 A1   Jan. 2, 2020

(51) Int. Cl.
| H05K 3/00 | (2006.01) |
| H05K 1/02 | (2006.01) |
| B23K 26/06 | (2014.01) |
| B23K 26/064 | (2014.01) |
| B23K 26/03 | (2006.01) |

(52) U.S. Cl.
CPC ......... *H05K 3/0038* (2013.01); *B23K 26/032* (2013.01); *B23K 26/0604* (2013.01); *B23K 26/064* (2015.10); *H05K 1/0269* (2013.01); *H05K 2203/0207* (2013.01)

(58) Field of Classification Search
CPC ............ B23K 2101/40; B23K 2101/42; B23K 2103/172; H05K 3/0038
See application file for complete search history.

(56) References Cited

U.S. PATENT DOCUMENTS

| 4,789,770 | A | 12/1988 | Kasner |
| 4,939,336 | A | 7/1990 | Meyer et al. |
| 4,988,877 | A * | 1/1991 | Stokowksi ......... G01N 23/2273 250/358.1 |
| 2002/0034325 | A1 | 3/2002 | Reinhorn et al. |
| 2005/0061779 | A1 | 3/2005 | Blumenfeld et al. |
| 2006/0202119 | A1 * | 9/2006 | Yamada ............... H01J 37/256 250/310 |
| 2009/0166340 | A1 | 7/2009 | Arai et al. |
| 2010/0258533 | A1 | 10/2010 | Foertsch et al. |

(Continued)

FOREIGN PATENT DOCUMENTS

| WO | 02/055255 A1 | 7/2002 |
| WO | 2014/064017 A2 | 5/2014 |
| WO | 2017/109787 A1 | 6/2017 |

OTHER PUBLICATIONS http://www.analog.com/en/design-center/evaluation-hardware-and-software/evaluation-boards-kits/eval-ada4530-1.html#eb-overview (Aug. 20, 2016).

(Continued)

*Primary Examiner* — Ibrahime A Abraham
*Assistant Examiner* — Dilnessa B Belay
(74) *Attorney, Agent, or Firm* — Browdy and Neimark, PLLC

(57) ABSTRACT

Disclosed herein is a system for drilling in a multilayer printed circuit board. The system includes a source of electromagnetic radiation configured to transmit a measurement pulse in open air to a workpiece, an anode, a resettable electric charge sensor (ECS), operably connected to the anode, and a control unit, configured to receive at least one value indicative of the quantity of at least part of charged molecules received at the anode and determine a second value indicative of the quantity of charged molecules received at the anode that were derivative of emitted electrons responsive to the measurement pulse.

10 Claims, 12 Drawing Sheets

(56) References Cited

U.S. PATENT DOCUMENTS

2010/0292679 A1    11/2010  Hoff et al.
2011/0180521 A1*   7/2011  Quitter ............... B23K 26/0622
                                                                  219/121.73
2015/0224600 A1     8/2015  Spiess et al.

OTHER PUBLICATIONS http://www.linear.com/product/LTC6268 (Nov. 3, 2015).
http://cds.linear.com/docs/en/datasheet/626810f.pdf (2015).
https://www.analog.com/en/parametricsearch/11070#!1021_>=1000!gbw_1000!vsmax_!sr_!ismax_!vos_!enoise_!vosdrift_!Ifnoise_!ibias_!inoise_ (Apr. 8, 2018).

* cited by examiner

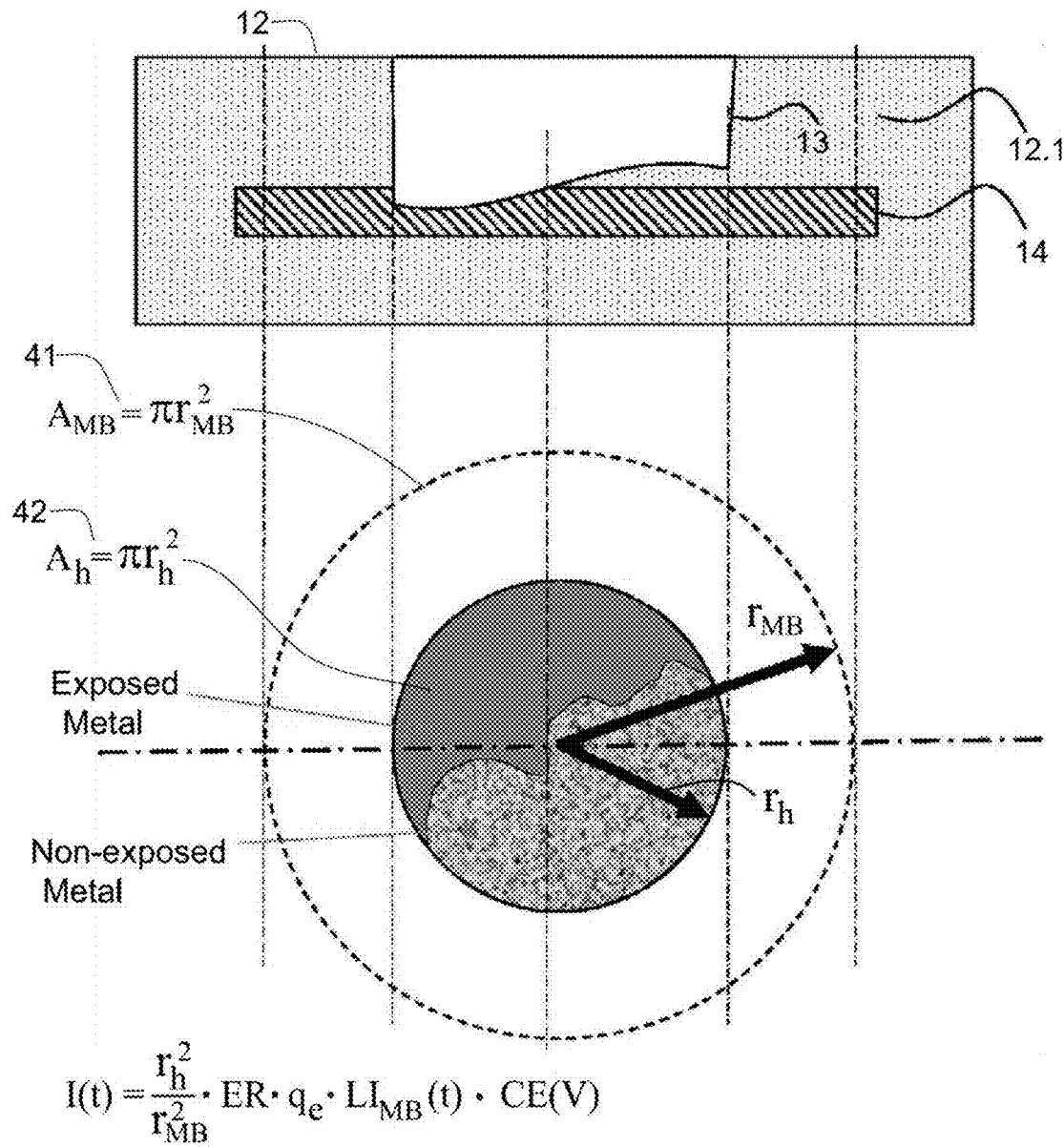

$$I(t) = \frac{r_h^2}{r_{MB}^2} \cdot ER \cdot q_e \cdot LI_{MB}(t) \cdot CE(V)$$

I(t)   is the measured electric current [ Ampere ]
ER    is the Exposure Ratio or metal in hole
       [ any number between 0 to 1 ]
*qe*   is the electron electric charge [Coulomb]
LI(t)  is the instantaneous measurement Light Intensity
       [photons per second]
CE(V)is is the Collection Efficiency of the free electrons which
       depends on offset voltage between anode and workpiece
       [ any number between 0 to 1 ]
At a certain moment in time:

$$I = K \cdot EB$$

FIG. 6

METAL SUBLAYER SENSING IN MULTI-LAYER WORKPIECE HOLE DRILLING

FIELD

The present subject matter relates to hole drilling by laser in a multi-layer workpiece where one or more of its sublayers is metal.

BACKGROUND

Printed Circuit Boards have a plurality of layers and contain embedded copper or other type metal foils. Such metal layers are electrically connected by means of conducting vias, either through-holes, buried vias or blind vias. In current technology, the diameter of such vias goes down to 10s of micro-meters, thus they are typically being drilled by short-duration high-energy laser pulses. Wavelengths of such lasers are usually in the range of 266-1500 nano-meter.

Problems of effective drilling in printed circuit boards have been recognized in the conventional art and various techniques have been developed to provide solutions, for example:

US publication 2005/0061779—Methods, for use with a laser ablation or drilling process, which achieve depth-controlled removal of composite-layered work-piece material by real-time feedback of ablation plasma spectral features. The methods employ the use of electric, magnetic or combined fields in the region of the laser ablation plume to direct the ablated material. Specifically, the electric, magnetic or combined fields cause the ablated material to be widely dispersed, concentrated in a target region, or accelerated along a selected axis for optical or physical sampling, analysis and laser feedback control. The methods may be used with any laser drilling, welding or marking process and are particularly applicable to laser micro-machining. The described methods may be effectively used with ferrous and non-ferrous metals and non-metallic work-pieces. The two primary benefits of these methods are the ability to drill or ablate to a controlled depth, and to provide controlled removal of ablation debris from the ablation site. An ancillary benefit of the described methods is that they facilitate ablated materials analysis and characterization by optical and/or mass spectroscopy.

U.S. Pat. No. 4,789,770—A controlled depth laser drilling system for a workpiece containing metallic conductors is provided having at least one laser beam where a portion of the laser beam will be reflected from the workpiece and back to a drilling depth monitoring means containing optical means capable of reflecting a portion of the original and reflected laser beams into radiation detector means where the detector means are capable of converting the radiation received into a measureable electric signals.

Publication WO 2014064017 A2/US 2015/0224600—The disclosure relates to methods and systems for piercing, drilling, or cutting metal workpieces in a laser processing operation. The methods include focusing a pulsed laser beam onto a processing location on a workpiece; detecting process radiation emitted from the processing location; determining an intensity of the process radiation at a plurality of temporally sequential times during pulse pauses; determining an intensity gradient of the process radiation; comparing the intensity gradient with a gradient threshold value; and detecting a spontaneous material removal on the workpiece when the number of times the gradient threshold value has been exceeded is above a predetermined limit value. When a spontaneous material removal is detected, the system changes one or both of a laser parameter and a processing parameter of the laser processing operation. The disclosure also relates to processing machines for carrying out the methods.

US publication 2010/0258533 A1—Methods and apparatus for separating of parts from workpieces is provided, in which at least one part is separated from a workpiece by means of radiation, in particular by means of laser radiation, and in which the radiation acts on the workpiece in a zone of interaction in such a way that regions of the workpiece are abraded, changed in their shape and/or are separated; in which the light intensity is received from the interaction zone and/or its vicinity and is transformed into electrical signals by a photoelectric sensor, and in which, with use of the electrical signals, it is determined when the processing procedure is to be terminated.

US publication 2010/0292679 A1—A method and apparatus to produce controlled ablation of material through the use of laser pulses of short pulse widths at short wavelengths.

US publication 2009/0166340 A1—A method and an apparatus for perforating a printed circuit board are provided so that the processing efficiency and the board densification can be improved. In test processing, a conductor layer is irradiated with a pulsed laser beam whose energy density is set at a value high enough to process the conductor layer while emission from a processed portion is monitored. Thus, the number of pulses of irradiation required for processing a window in the conductor layer is obtained. An insulating layer is irradiated with a pulsed laser beam whose energy density is set at a value high enough to process the insulating layer but low enough not to process a conductor layer under the insulating layer. Thus, the number of pulses of irradiation required for processing a window in the insulating layer is obtained. The conductor layer is irradiated with the laser beam the obtained number of pulses of irradiation, and the insulating layer is irradiated with the laser beam the obtained number of pulses of irradiation. Thus, a hole is processed in the printed circuit board.

The references cited above teach background information that may be applicable to the presently disclosed subject matter. Therefore the full contents of these publications are incorporated by reference herein where appropriate for appropriate teachings of additional or alternative details, features and/or technical background.

SUMMARY

One challenge while drilling a via in a multilayer workpiece is to stop the laser energy once the target metal sublayer has been fully exposed. On one hand, halting the drilling process too early while the metal sublayer has not been fully exposed may cause electrical disconnect at later stages of the process. While on the other hand, applying additional laser energy after the metal sublayer has been fully exposed may result in a thinner metal sublayer which, in turn, may cause metal breakdown or impair signal integrity of that metal trace.

Some embodiments of the subject matter may comprise methods of controlling the laser ablation process while drilling micron and sub-micron holes in a multi-layer workpiece. More specifically, some embodiments of the subject matter may enable real-time accurate feedback on the drill process while it transitions from drilling one sublayer to the following sublayer.

In some embodiments, the drilling process may detect that at a specific drill laser pulse out of a series of drill laser pulses the upper insulating sublayer has been fully removed (thus the lower sublayer has been fully exposed without any upper sublayer remaining). The drilling process may then be stopped with minimal impact on the lower metal sublayer. This may prevent further drill pulses beyond that point which may further thin/puncture the lower sublayer and affect its signal integrity, resistance, impedance, capacitance, inductance and/or any other electrical or mechanical property, for instance, if the lower sublayer is a conducting metal trace.

Furthermore, in some embodiments, the drilling process may detect the initial partial exposure of the lower metal sublayer, so that the drill laser intensity may be adjusted to achieve finer spatial and depth granularity.

Embodiments of the current subject matter may be preferable to alternatives such as monitoring the number of pulses without taking into account unintended losses due to, for example, variability in sublayer thickness. Similarly, an overshoot approach may have an impact on the lower metal sublayer, e.g. by thinning or puncturing it, while an undershoot approach might have the result that the lower metal sublayer is not fully exposed.

In accordance with one aspect of the presently disclosed subject matter there is provided a method of drilling in a workpiece with a plurality of layers comprising: drilling at least one hole in said workpiece; directing toward at least one metal layer in said workpiece at location of said at least one hole electromagnetic radiation having at least one wavelength with higher energy than a work-function of said at least one metal layer, thereby causing said at least one metal layer to emit free electrons; measuring at least one value indicative of quantity or intensity of at least part of electrically charged particles derived from said emitted free electrons, said at least one measured value being useable for indicating at least one of: exposure or disappearance of said at least one metal layer during drilling.

The method can further comprise: providing at least one of an electric field or a magnetic field capable of affecting movement of electrically charged particles, wherein said at least one value is indicative of quantity or intensity of electrically charged particles derived from free electrons emitted by said at least one metal layer which emerged from said workpiece, said electrically charged particles moved at least partly in accordance with said at least one field.

The method can further comprise: identifying at least one of: exposure or disappearance of said at least one metal layer at least partly based on said at least one measured value.

The method can further comprise: providing said at least one measured value to either an operator or a control unit.

In accordance with another aspect of the presently disclosed subject matter, at least part of said at least one hole is drilled through at least one non-metal layer in said workpiece in order to expose at least one of the at least one metal layer underneath, or at least part of said at least one hole is drilled through one or more of the at least one metal layer in order to remove the one or more of the least one metal layer.

In accordance with another aspect of the presently disclosed subject matter there is provided a system for use when drilling at least one hole in a workpiece with a plurality of layers, comprising:

at least one source of electromagnetic radiation having at least one wavelength with higher energy than a work-function of at least one metal layer in said workpiece;

optical conveying means for directing said electromagnetic radiation toward said at least one metal layer, so as to cause said at least one metal layer to emit free electrons;

means for measuring at least one value indicative of quantity or intensity of at least part of electrically charged particles derived from said free electrons, said at least one measured value being useable for indicating at least one of: exposure or disappearance of said at least one metal layer during drilling.

In accordance with another aspect of the presently disclosed subject matter there is provided a system, comprising:

at least one drilling laser for drilling in a workpiece;

at least one electromagnetic radiation source having at least one wavelength with higher energy than a work-function of at least one metal layer in said workpiece;

optical conveying means for directing electromagnetic radiation from said at least one source and from said at least one drilling laser toward said workpiece; and at least one collecting frame for affecting movement of at least some electrically charged particles derived from free electrons emitted by said at least one metal layer that exited said workpiece.

The system may further comprise at least one electric current sensor configured to measure at least one value that is indicative of quantity or intensity of said electrically charged particles having movement which was affected by said at least one collecting frame, said at least one measured value being useable for indicating at least one of: exposure or disappearance of said at least one metal layer during drilling.

The collecting frame may include at least one of the following: at least one voltage source, at least one anode, at least one cathode, at least one coil, or at least one magnet.

The optical conveying means may be used both for electromagnetic radiation from said at least one source and for electromagnetic radiation from said drilling laser.

The optical conveying means may include at least one of: at least one mirror, or at least one Wavelength Division Multiplexer ("WDM").

The electromagnetic radiation from said at least one source may be synchronized with electromagnetic radiation from said at least one drilling laser.

In accordance with another aspect of the presently disclosed subject matter there is provided a system, comprising:

at least one drilling laser for drilling in a workpiece, having at least one wavelength with higher energy than a work-function of at least one metal layer in said workpiece;

optical conveying means for directing electromagnetic radiation from said at least one drilling laser toward said workpiece;

at least one collecting frame for affecting movement of at least some electrically charged particles, derived from free electrons emitted by said at least one metal layer that exited said workpiece.

The system may further comprise at least one electric current sensor configured to measure at least one value that is indicative of quantity or intensity of said electrically charged particles having movement which was affected by said at least one collecting frame, said at least one measured value being useable for indicating at least one of: exposure or disappearance of said at least one metal layer during drilling.

The collecting frame may include at least one of the following: at least one voltage source, at least one anode, at least one cathode, at least one coil, or at least one magnet.

The optical conveying means may be used both for electromagnetic radiation from said at least one source and for electromagnetic radiation from said drilling laser.

The optical conveying means may include at least one of: at least one mirror, or at least one Wavelength Division Multiplexer ("WDM").

The electromagnetic radiation from said at least one source may be synchronized with electromagnetic radiation from said at least one drilling laser.

In accordance with one aspect of the presently disclosed subject matter, there is provided a system comprising a control unit configured to receive a value indicative of quantity or intensity of electrically charged particles derived from free electrons that were emitted by at least one metal layer in a workpiece due to electromagnetic radiation directed to the at least one metal layer, having at least one wavelength with higher energy than a work-function of the at least one metal layer, wherein said at least one control unit is further configured to perform compare said at least one value to a threshold or to an envelope, said at least one control unit being further configured to identify exposure or disappearance of said at least one metal layer based on outcome of said compare to said at least one threshold or envelope, or to control drilling based on outcome of said compare to said at least one threshold or envelope.

The control unit may be configured to control drilling of at least one hole in at least one of said at least one metal layer that is being removed and above at least one non-metal layer in said workpiece.

The control unit may be configured to control drilling includes being configured to identify at least one of: start of removal of said at least one of said at least one metal layer, or completion of removal of said at least one of said at least one metal layer.

The control unit may be configured to control drilling of at least one hole in at least one non-metal layer in said workpiece which is above at least one of said at least one metal layer in order to expose said at least one of said at least one metal layer.

The control unit may be configured to control drilling includes being configured to identify at least one of: start of exposure of said at least one of said at least one metal layer, or completion of exposure of said at least one of said at least one metal layer.

The control unit may be configured to control drilling by controlling at least one parameter relating to drilling selected from a group comprising: pulse wavelength, pulse intensity, pulse duration, pulse interval, or pulse shape.

The control unit may be configured, based at least partly on at least one of: number of holes being drilled in said at least one metal layer, or capacitance of said at least one metal layer, to control at least one parameter related to at least one collecting frame affecting movement of said at least part of free electrons.

The parameters related to the collecting frame may include at least one of: offset voltage, anode voltage, magnetic field direction, or magnetic field intensity.

In accordance another one aspect of the presently disclosed subject matter, there is provided a computer program product comprising a computer useable medium having computer readable program code embodied therein, said computer program product comprising:

computer readable program code for causing a computer to receive at least one value indicative of quantity or intensity of at least part of electrically charged particles deriving from free electrons that were emitted by at least one metal layer in a workpiece due to electromagnetic radiation, directed to the at least one metal layer, having at least one wavelength with higher energy than a work-function of the at least one metal layer; and computer readable program code for causing the computer to perform at least one of: compare at least part of said at least one value or at least one combination of at least part of said at least one value to at least one threshold, or calculate an envelope of at least part of said at least one value or of at least part of said at least one combination computer readable program code for causing the computer to perform at least one of: identify at least one of: exposure or disappearance of said at least one metal layer at least partly based on outcome of said compare to said at least one threshold, identify at least one of: exposure or disappearance of said at least one metal layer at least partly based on said calculated envelope, control drilling at least partly based on outcome of said compare to said at least one threshold, or control drilling at least partly based on said calculated envelope.

The product may also comprise: computer readable program code for causing the computer, based at least partly on at least one of: number of holes being drilled in said at least one metal layer, or capacitance of said at least one metal layer, to control at least one parameter related to at least one collecting frame affecting movement of electrically charged particles.

In accordance with one aspect of the presently disclosed subject matter, there is provided a system comprising:

a source of electromagnetic radiation configured to transmit a measurement pulse in open air to a workpiece, the pulse having at least one wavelength with higher energy than a work-function of a metal layer of the workpiece, and giving rise to electrically charged molecules deriving from free electrons that were emitted by the metal layer in the workpiece, the quantity of free electrons emitted being dependent on the extent of exposure of the metal of the workpiece;

an anode;

a resettable electric charge sensor (ECS), operably connected to the anode;

a control unit, operably connected to the ECS, and configured to:

receive, from the ECS, at least one value indicative of the quantity of at least part of charged molecules received at the anode since ECS activation, determine, from the at least one value, a second value indicative of the quantity of charged molecules received at the anode that were derivative of emitted electrons responsive to the measurement pulse;

wherein said at least one control unit is further configured to perform at least one of:

compare at least part of said second value or at least one combination of at least part of said second value to at least one threshold, or calculate an envelope of at least part of said second value or of at least part of said at least one combination, said at least one control unit being further configured to perform at least one of:

identify at least one of: exposure or disappearance of said at least one metal layer at least partly based on outcome of said compare to said at least one threshold, identify at least one of: exposure or disappearance of said at least one metal layer at least partly based on said calculated envelope, control drilling at least partly based on outcome of said compare to said at least one threshold, or control drilling at least partly based on said calculated envelope.

In addition to the above features, the system according to this aspect of the presently disclosed subject matter can comprise one or more of features (i) to (ix) listed below, in any desired combination or permutation which is technically possible:

(i) the ECS is further configured to provide data indicative of charge that has been accumulated from the charged molecules since activation.

(ii) the data indicative of charge that is configured to be provided comprises a voltage.

(iii) the ECS is configured to activate according to the time of initiation of a measurement pulse, in combination with a first molecule delay adjustment, and wherein the control unit is configured to receive the at least one value according to the time of cessation of the measurement pulse, in combination with a second molecule delay adjustment.

(iv) each molecule delay adjustment is determined according to at least one of: one or more tracked molecule types, an electric field potential of the anode, temperature of the open air.

(v) the control unit is configured to periodically receive the at least one value, thereby giving rise to a signal, and wherein the control unit is configured to determine—by signal processing methods—the second value indicative of the quantity of the charged molecules received at the anode that were derivative of emitted electrons responsive to a measurement burst.

(vi) the control unit is further configured to compensate for switching noise in the at least one value.

(vii) the control unit is further configured to compensate for leakage current in the at least one value.

(viii) the pulse energy of the radiation source is configured so that workpiece potential emerging due to electrons emitted from the metal layer of a given composition over a number of pulses, according to the composition, the pulse energy, and the number of pulses, is no more than 10% of the anode voltage.

(ix) the ECS is configured with sensitivity no larger than 1% of the charge of electrons emerging emitted from the metal layer according to its composition and the pulse energy of the radiation source.

In accordance with one aspect of the presently disclosed subject matter, there is provided a system comprising:
a source of electromagnetic radiation directed in open air to at least one metal layer in a workpiece, the electromagnetic radiation having at least one wavelength with higher energy than a work-function of the at least one metal layer;
an anode, the anode having a voltage sufficient to impose an electric field that accelerates at least part of electrically charged molecules deriving from free electrons that were emitted by at least one metal layer in the workpiece due to the photoelectric effect, thereby causing at least part of said electrically charged molecules to arrive at the anode;
at least one control unit configured to receive at least one value indicative of quantity or intensity of at least part of said electrically charged molecules, wherein said at least one control unit is further configured to perform at least one of:

compare at least part of said at least one value or at least one combination of at least part of said at least one value to at least one threshold, or calculate an envelope of at least part of said at least one value or of at least part of said at least one combination, said at least one control unit being further configured to perform at least one of:

identify at least one of: exposure or disappearance of said at least one metal layer at least partly based on outcome of said compare to said at least one threshold, identify at least one of: exposure or disappearance of said at least one metal layer at least partly based on said calculated envelope, control drilling at least partly based on outcome of said compare to said at least one threshold, or control drilling at least partly based on said calculated envelope.

BRIEF DESCRIPTION OF THE DRAWINGS

In order to understand the subject matter and to see how it can be carried out in practice, non-limiting embodiments will be described, with reference to the accompanying drawings, in which:

FIG. 5 illustrates an equivalent electric circuit of the process described herein, in accordance with some embodiments of the present subject matter; and.

FIG. 6 illustrates a visualized analytic model of the measurement process, in accordance with some embodiments of the present subject matter.

DETAILED DESCRIPTION

Figure 1:
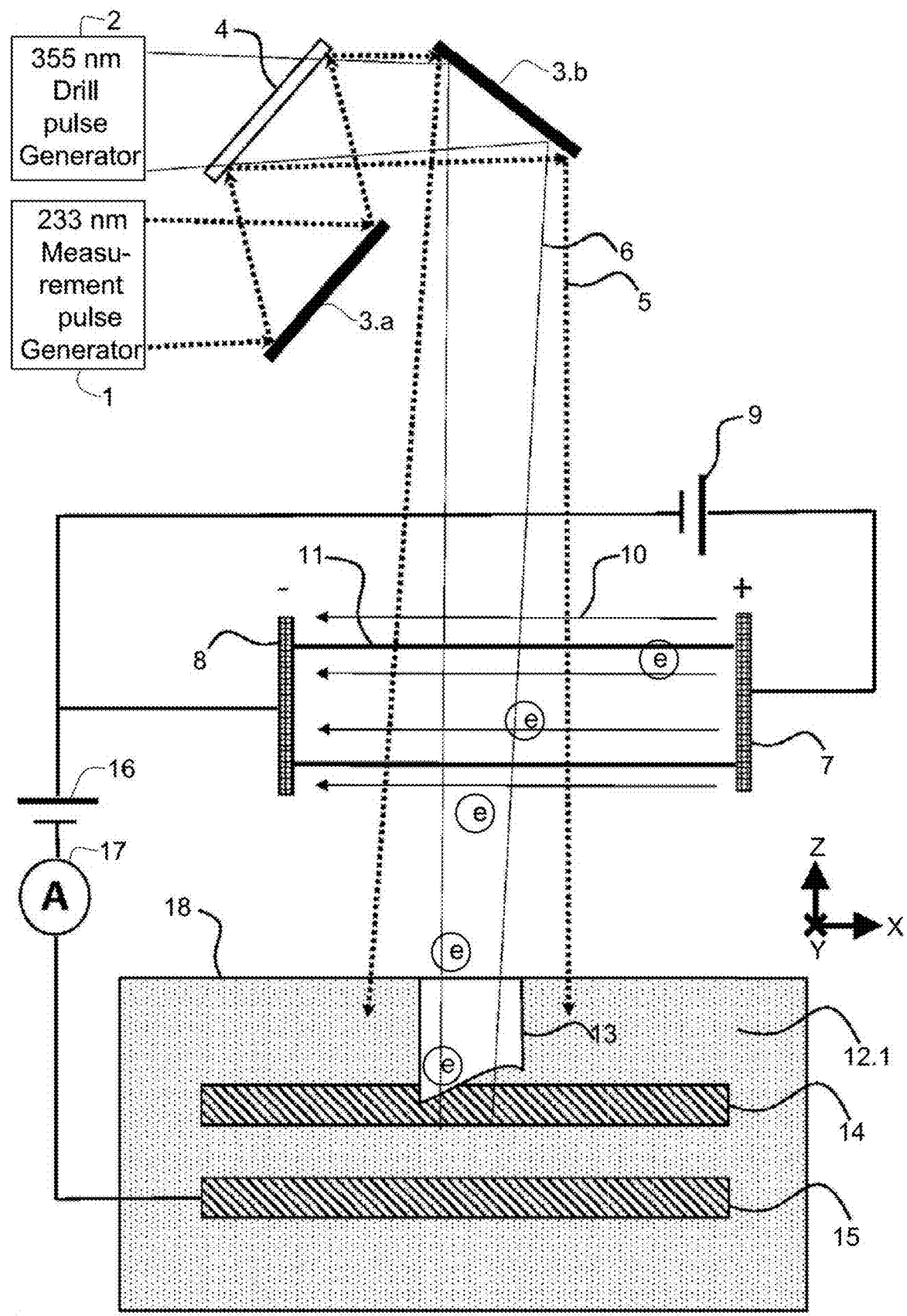
FIG. 1 illustrates a cross-sectional front view of a basic laser drilling setup, in accordance with some embodiments of the present subject matter.

In the following detailed description, numerous specific details are set forth in order to provide a thorough understanding of the subject matter. However, it will be understood by those skilled in the art that the current subject matter may be practiced without these specific details. In other instances, well-known methods, procedures, components and circuits have not been described in detail so as not to obscure the current subject matter.

Usage of the terms "such as", "e.g.", "possibly", "potentially", "it is possible", "optionally", "for example," "for instance", "an example" "one example", "illustrated example", "illustrative example", "some examples", "another example", "other examples", "various examples", "examples", "some embodiments", "some of these embodiments" "other embodiments", "many embodiments", "one embodiment", "illustrative embodiment", "another embodiment", "some other embodiments", "illustrated embodiments", "embodiments", "instances", "one instance", "some instances", "another instance", "other instances", "one case", "some cases", "another case", "other cases", "cases", or variants thereof means that a particular described method, procedure, component or circuit is included in at least one example of the subject matter, but not necessarily in all examples. The appearance of the same term does not necessarily refer to the same example(s).

Usage of conditional language, such as "may", "might", or variants thereof should be construed as conveying that one or more examples of the subject matter may include, while one or more other examples of the subject matter may not necessarily include, certain methods, procedures, components and circuits. Thus such conditional language is not generally intended to imply that a particular described method, procedure, component or circuit is necessarily included in all examples of the subject matter. Moreover, the usage of non-conditional language does not necessarily imply that a particular described method, procedure, component or circuit is necessarily included in all examples of the subject matter.

Unless specifically stated otherwise, as apparent from the following discussions, it is appreciated that throughout the specification discussions utilizing terms such as "processing", "computing", "representing", "comparing", or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the control unit disclosed herein.

It should be appreciated that certain embodiments, methods, procedures, components and circuits disclosed herein, which are, for clarity, described in the context of separate examples, may also be provided in combination in a single example. Conversely, various embodiments, methods, procedures, components or circuits disclosed herein, which are, for brevity, described in the context of a single example, may also be provided separately or in any suitable sub-combination.

The operations in accordance with the teachings herein may be performed by a computer specially constructed for the desired purposes or by a general-purpose computer specially configured for the desired purpose by a computer program stored in a non-transitory computer-readable storage medium.

The term "measurement light" used herein should be expansively construed to include any form of light which consists of photons with photon-energy high enough to cause photoelectric effect in a metal. In that sense, the term light may include electro-magnetic wave radiation.

The term "work function" used herein should be construed to include the energy required to release an electron from solid metal to the free air or to a point in the vacuum immediately outside of the solid surface. Each metal and each structure has its own work-function energy. If photon energy is higher than work-function energy, then such a photon may cause an electron to be emitted from solid metal upon colliding with it. If photon energy is smaller than work-function energy, i.e. its wavelength is higher than associated wavelength of work-function then such photon will never be able to release an electron from that metal. Work-function energy for metals are known to those skilled in the art. For instance, in copper the work-function is 4.53-5.10 eV (cf. Wikipedia, work-function depends on a specific solid structure). In aluminum it is 4.06-4.26 eV.

The term 'wavelength that is shorter than the metal work function' used in this patent application should be construed to include a wavelength with photon energy high enough to release an electron from the particular metal. Photon energy is defined by its wavelength. A photon with shorter wavelength has higher energy. Photon energy is defined by dividing the product: hxc by photon wavelength (Lambda [m]), where 'h' is Plank's constant and 'c' is the speed of light (see Eq. 1).

Some embodiments of the present subject matter relate to drilling a hole by laser in a multi-layer workpiece wherein one or more of its sublayers is metal. Some embodiments of the subject matter relate to providing feedback regarding the drilling quality during the transition between non-metal sublayers and metal sublayers In some embodiments of the subject matter the feedback information may be utilized to control the drilling process.

Some embodiments of the present subject matter may be applicable, for example, to high-energy laser drill pulses with very short duration (e.g. 10-30 ns pulse width), usually common to Printed Circuit Boards (PCB) or semiconductor industry (packaging and substrate). Common related terms include: buried via, buried hole, micro via (10-30 um) where the vertical conductor (aka VIA) is partially or completely buried inside the substrate/PCB, and cannot be seen from the outside unless using X-Ray or such in-depth imaging.

Some embodiments of the current subject matter may provide measured value(s) indicative of the beginning of metal exposure and indicative that the metal sublayer has been fully exposed during the drilling process.

Although for ease of description, the description herein refers to a single item of a certain label (e.g. lens 39, hole 13, beam 12, sensor 17 etc.), it should be understood that the description contemplates embodiments with a plurality of items per label (e.g. lenses 39, holes 13, beams 12, sensors 17, etc.).

Attention is now drawn to FIG. 1, which illustrates a cross-sectional front view of a basic laser drilling setup in accordance with certain embodiments of the presently disclosed subject matter. A drilling laser source 2 may emit drilling laser pulses to a printed circuit board (PCB) 12 via an optical conveying system including WDM filters 4, mirror 3.*a* for X direction, and or another mirror 3.*b* for Y direction. The optical conveying system may direct the drilling laser beam 6 to the target work zone 13 on the PCB 12. The PCB 12 may be laminated by insulator material sublayers 12.1 and one or more conductor sublayers 14 and 15. In this illustration, the hole 13 being drilled in the PCB 12 has partially reached the metal sublayer 14.

In some embodiments of the current subject matter, there may be a measurement light source 1 to monitor and measure the drilling process in real time. The measurement light source 1 may have at least one wavelength with higher energy than the work-function of the metal sublayer 14 being drilled. In cases where the conductor sublayers consist of several substances, the source of measurement light 1 may include at least the wavelength of the metal sublayer which has the highest work-function.

The quantity of free electrons 18 released by such illumination 5 may provide indications regarding the rate of exposure of a metal sublayer, e.g. whether a metal sublayer 14 has just emerged, or whether a metal sublayer 14 has been fully exposed to the full extent of the hole cross-section area. The measurement light beam 5 is directed to the work zone 13 on a workpiece 12 in a manner similar to the drill laser beam 6. The measurement light beam 5 may cover the work zone sufficiently—including the entire area of the hole 13. If beam direction accuracy is not good enough then it may be preferable to set the measurement beam coverage at the work zone to be greater than the hole area 13. When the measurement light is on, there may be free electrons 18 above the hole area 13. These free electrons 18 have kinetic energy which is the delta between the measurement light photon energy and the specific metal sublayer work-function energy:

$$E_k = \frac{h \cdot c}{q \cdot \lambda} - \Phi \qquad \text{Eq. 1}$$

Where, $E_k$ is free electron kinetic energy [eV], 'h' is Planck constant (6.63E-34 [J*Sec]), 'q' is the electron's electric charge [Coulomb], 'c' is the speed of light in free air [m/s], $\lambda$ is the measurement light wavelength [m], and, $\Phi$ is the metal sublayer work-function energy [eV].

An anode 7 may be placed in proximity to the hole 13 above the upper surface of workpiece 12. Free electrons 18 which are released due to the photoelectric effect by means of measurement light (as discussed above) may move under an electric field 10 towards anode 7. Anode voltage may create a strong enough electric field to divert electrons towards the anode while taking into account electron mass and electron velocity. As explained earlier, electron velocity, or electron kinetic energy, depends on measurement laser wavelength. In these embodiments, each measurement light pulse 5 may cause an electric current pulse from the voltage source 9 to anode 7. The reason for that electric current is that each free electron 18 that hits anode 7 may cause voltage drop in the anode 7. Anode voltage source 9 may not 'tolerate' any anode voltage which does not exactly match its own voltage. Thus, voltage source 9 may immediately fill up any 'missing' electric charge by sending a positive electric current pulse to anode 7, to compensate for the electric charge reduction caused by free electron 18 hitting anode 7.

Such electric current pulses may be detected and measured by electric current sensor 17. The electric current sensor 17 may comprise, for example, a device that measures a value relating to the existence of electric current, such as its intensity, its duration, or the like. The electric current sensor 17 may provide the measured value in any format, such as a format that may be used by an operator (e.g. viewing a display), or by a control unit (described in more detail below with reference to FIG. 7) that may perform analysis of the measured value(s).

More specifically, the electric current sensor 17 may comprise a resistor which generates voltage across its leads according to Ohm's law (V=I×R, where 'R' is resistor resistance, and 'I' is electric current pulse amplitude). Alternatively, the electric current sensor 17 may include a coil which is highly sensitive to electric current changes, and/or a capacitor which can act as an electric current integrator (i.e. collect electric charge over time). The subject matter is not limited to these electric current sensors and any appropriate type of electric current sensor may be used for electric current sensor 17. In some embodiments, the electric current sensor 17 may include an amplification stage to adjust the output voltage levels to the full dynamic range of an optional subsequent Analog-to-Digital converter. Alternatively, a Trans-Impedance-Amplifier (TIA) may be used to translate short-in-time and low-amplitude electric current pulses into measureable signals.

The electric current sensor 17 is here exemplarily depicted in connection with anode 7, but may be placed in many other locations along the electric circuit.

In cases where the measurement light photon energy exceeds the metal work function significantly, the free electron's kinetic energy may be very high. In such cases, the associated DeBroglie wavelength of the free electrons may be short enough to create diffraction patterns with mode 0 being perpendicular to metal surface, and modes 1, 2, 3, 4 . . . deflected at increasing angles. When free electrons 18 are scattered at various angles it may be harder to collect all of them into one place. The current subject matter may be optimized when all free electrons 18 are collected by anode 7 thus resulting with full scale electric current pulse measurement.

Voltage source 9 is used to create electric field 10 between an anode 7 and a cathode 8 which is strong enough to accelerate electrons towards anode 7 while taking into account electron mass and electron velocity in other directions. Voltage source 16 creates an offset voltage between the workpiece and collecting frame 11 to overcome electric potential buildup at the metal trace 14, as will be explained later.

In some embodiments of the current subject matter, the measurement pulse generator 1 may comprise a laser—a laser being easy to focus and align.

In some embodiments of the current subject matter, the measurement pulse generator 1 may comprise a light source which has wavelengths with higher energies than the 'Work-Functions' of the metals inside the workpiece (e.g. Lambda<266 nm for copper).

In some embodiments of the current subject matter, the measurement pulse interacts with only one hole being drilled in the workpiece.

In other embodiments of the current subject matter, the measurement pulse interacts with more than one hole in the workpiece.

It should be noted that while free electrons travel in open air they may interact with air molecules on their path. Molecules such as $O_2$ and $CO_2$ have good affinity to interact with free electrons. Such an interaction may result in secondary radiation. One manner of interaction is that low energy electrons may be absorbed by a molecule, making that molecule negatively charged. Another possible manner of interaction is that the free electron may have enough energy to knock out an electron from the molecule leaving the molecule positively charged (and two deflected free electrons). If the electron has very high energy it may knock out few electrons from several molecules leaving each of these molecules positively charged. In extreme cases an avalanche effect may result, where knocked-out electrons gain significant amount of energy by strong electric field so they can knock-out new electrons by themselves.

In any of the above cases, there may be electrically charged particles left at the region of interaction. These electrically charged particles may include free electrons emitted from the submetal layer, negatively charged particles affected by free electrons emitted from the submetal layer, and/or positively charged particles affected by free electrons emitted from the submetal layer. Such electrically charged particles constitute examples of what are herein termed as particles "derived from" emitted free electrons.

These electrically-charged particles will accelerate according to the electric field forces which anode 7 and/or cathode 8 impose. These particles may arrive at anode 7 or cathode 8 in a similar way as the free electron which had not interacted. The only difference is the magnitude of acceleration due to mass differences between electron mass and molecule mass. The effective outcome of such interaction is that it will take longer time for such negatively-charged molecule to arrive at anode 7 relative to a free electron or, alternatively, to a positively-charged particle to arrive at cathode 8. The type of interaction that is dominant is determined by the wavelength of measurement beam and anode-cathode voltage. It is important to choose these values (wavelength and anode-cathode voltage) so as to maximize and optimize the effect of free electrons being released from the metal by the photoelectric effect.

It is noted that the teachings of the presently disclosed subject matter are not bound by the laser drilling system described with reference to FIG. 1. Equivalent and/or modified functionality can be consolidated or divided in another manner and can be implemented in an appropriate manner which includes additional and/or combined and/or replaced elements.

Figure 2:
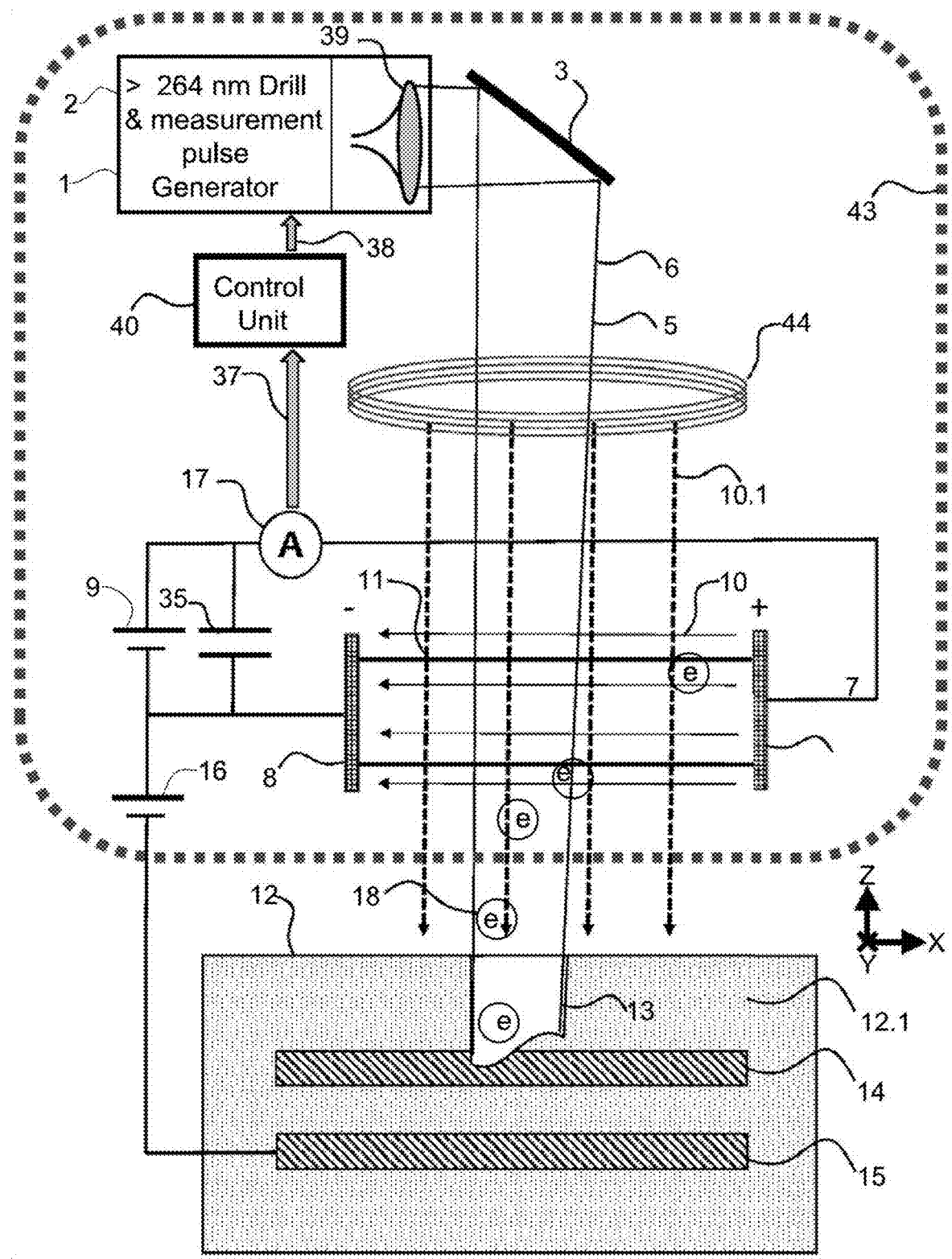
FIG. 2 illustrates another cross-sectional front view of an alternative embodiment of a drilling setup, including a control unit for adjustment of drilling parameters, in accordance with some embodiments of the present subject matter.

FIG. 2 illustrates another cross-sectional front view of an alternative embodiment of a drilling setup in accordance with some embodiments of the present subject matter including several additional features, where each of these features or components thereof may be implemented independently or in combination with the embodiment described above with reference to FIG. 1.

The illustrated embodiment includes an adapted drilling laser machine which may facilitate both drilling and measuring using a single radiation light source. Such an adapted drilling laser machine may include what is inside dotted line 43.

In this embodiment, drill and measurement pulse generator 2 may utilize the same radiation light source for both drilling and for measurement. Drill and measurement pulse generator 2 may comprise a controlled measurement laser source, a WDM filter to combine the drilling laser beam with the measurement laser beam, as well as a lens 39 to further improve guidance of radiation towards drill site i.e. hole 13 at the workpiece.

The illustrated embodiment additionally includes a control system which may enable use of output 37 from electric current sensor 17 to control the drilling process. Control unit 40, may include, for example, a computer such as a Central Processing Unit (CPU) or Digital Signal Processor (DSP). Output 37 of electric current sensor 17 may include measured value(s) which describe the amplitude of electric current vs. time. Output 37 may be, for example, an analog representation, or alternatively a digitized series of values per measurement time interval using an Analog-to-Digital converter. Such output may be collected at control unit 40, in order to control the drill laser pulses generated by the drill and measurement pulse generator 2.

Drilling laser parameters that may be controlled in this manner include, for example: wavelength, pulse intensity, pulse duration, the pulse interval, pulse shape, and combinations thereof. Varying the wavelength may increase or reduce the energy of the pulse, whereas varying the pulse intensity may increase or reduce the energy provided at a specific drilling location. The duration of the pulse may affect the size of the area ablated ie. a longer pulse may result in a wider affected area. Following the laser pulse, the active zone at the workpiece may cool down. Thus, lengthening the pulse interval may increase the cooling and prevent melting in the next pulse. Varying the pulse shape may increase or reduce the temperature profile at the drill zone—if temperature builds up too quickly there may be mini-explosions and associated debris.

In some embodiments, output 37 of electric current sensor 17 may simply be displayed and not received or processed by a control unit 40 or used for drilling control.

A coil 44 carrying electric current may be included to create magnetic field 10.1 vectored at z-axis. The magnetic field 10.1 may be used, in addition to or instead of the electric field, to capture electrons which are scattered at different angles (mode 1, 2, 3 . . . ) in a spiral path that leads them along the magnetic field direction towards anode 7 or any other detector. Alternatively, such a magnetic field can be created by a permanent magnet. Electrons having a velocity vector which is not completely parallel to the magnetic field direction will move in a spiral path. The radius of spiral path is given by: $r = m\ v/(B'\ q)$. 'r' is spiral path radius, 'm' is electron mass, 'v' is electron velocity component in XY-plane, B' is magnetic field intensity, and 'q' is electron's electric charge. Thus, a stronger magnetic field may reduce the spiral radius. The axis of the spiral is parallel to the magnetic field vector. If both electric field 10 and magnetic field 10.1 in the right orientation are used, a higher collection effectiveness of free electrons 18 may be achieved compared to when only electric field 10 or only magnetic field 10.1 is used. A higher collection ratio may generate a stronger electric current pulse which may improve measurement accuracy.

A coupling capacitor 35 may improve the system's signal to noise ratio performance. This capacitor may be placed near anode 7, in parallel to anode 7 and cathode 8, and in parallel to anode voltage source 9.

In some embodiments of the current subject matter, the electric current sensor 17 may be electrically connected to an anode 7 which collects free electrons 18.

In other embodiments of the current subject matter, the electric current sensor 17 may be located between the voltage source 9 of the anode 7 and the voltage source 16 which offsets the workpiece from the collecting frame 11.

In other embodiments of the current subject matter, the electric current sensor 17 may be located between the workpiece and the voltage source 16 which offsets the workpiece from the anode 7.

In some embodiments of the current subject matter, the anode may be made of a horizontal ring or surface. In such configuration there is no cathode 8, and instead the workpiece 12 acts as a cathode. Furthermore, in such a configuration, anode voltage source 9 and offset voltage source 16 can be combined into one voltage source instead of two voltage sources in series.

In some embodiments of the current subject matter, the voltage source 16 which offsets the workpiece from the anode 7 may comprise one voltage source or a series of several voltage sources connected in series.

In some embodiments of the current subject matter, the anode 7 may be made of a vertical plate.

In some embodiments of the current subject matter, the electric current sensor 17 may sense the derivative of measured electric current pulse.

In other embodiments of the current subject matter, the electric current sensor 17 may sense the electric current with or without amplification.

In some embodiments of the current subject matter, the electric current sensor 17 may measure the accumulation of electric current i.e., the electric charge, which is released during a single measurement light pulse.

In some embodiments of the current subject matter, the electric current sensor 17 may measure the accumulation of electric charge which is released during several measurement light pulses.

In some embodiments of the current subject matter, the electric current sensor 17 may measure any combination of (1) derivative of electric current, (2) electrical current (3) with or without amplification, (4) accumulation of electric current i.e., the electric charge. All of which of a single measurement pulse or a series of several measurement pulses.

In some embodiments of the current subject matter, the measurement of electrons 18 released during the illumination period may be accomplished by directly measuring current or electric charge.

In other embodiments of the current subject matter, the measurement of electrons released during the illumination period may be accomplished by measuring a secondary effect which is caused by the travel of free electrons in open air between the workpiece and an anode (e.g. florescence, collisions with air molecules, sensing electron path in the air on the way to anode, transforming the electron path into a light, or the like). It is possible to add a specific gas flow to the region in which free electrons pass in order to enhance their interaction with such gas, by a secondary radiation effect.

In some embodiments of the current subject matter, the control unit 40 may calculate the gradient between successive measured electric current pulses so as to determine the status of a process of initially exposing a metal sublayer 14, full exposure, or completed drilling and exiting of a metal sublayer 14.

In some embodiments of the current subject matter, the electric current pulse generated by the measurement light pulse may be amplified by means of Trans-Impedance-Amplifier or current amplifier or without amplification.

In some embodiments of the current subject matter, the measurement electric current sensor 17 may comprise Analog-to-Digital conversion, an oscilloscope, DSP, or an ampere-meter.

In some embodiments of the current subject matter, there may be a magnetic field in any combination of XY-plane or Z-axis either in the positive direction or in negative direction.

In some embodiments of the current subject matter, the magnetic field 10.1 may cover the entire workpiece area.

In some embodiments of the current subject matter, the magnetic field 10.1 may cover only part of the workpiece.

In some embodiments of the current subject matter, the voltage offset 9 of the anode 7 may be adjusted according to a specific metal sublayer 14 capacitance.

In some embodiments of the current subject matter, the voltage offset 9 of the anode 7 may be adjusted according to the number of holes 13 being drilled in a specific metal sublayer 14.

In some embodiments of the current subject matter, a high frequency rotating magnetic field 10.1 in XY plane may be applied to keep the electrons 18 circulating above the hole 13 (in circular movement). The purpose of such a rotating field is to keep the electrons 18 circulating above the hole 13, measure the electron spiral loops and then let them fall back into the hole due to metal trace potential once the magnetic field is turned off. In some embodiments using a rotating magnetic field, electron loops may be measured by light inflected on the electron loop region. In some embodiments, a gas material may be applied to the area in which free electrons 18 are circulating to enhance an interaction of free electrons 18 with such gas material by means of a secondary effect.

An advantage of an embodiment including an adapted laser system may be that the expensive and complicated optics guiding control system may be used for both the drilling laser and measurement laser without any need to synchronize two different guiding systems or to overcome interference of such two systems one with the other in such a small space.

It is noted that the teachings of the presently disclosed subject matter are not bound by the laser drilling system described with reference to FIG. 2. Equivalent and/or modified functionality can be consolidated or divided in another manner and can be implemented in an appropriate manner which includes additional and/or combined and/or replaced elements and/or any appropriate combination of software with firmware and/or hardware and executed on a suitable device.

Figure 3:
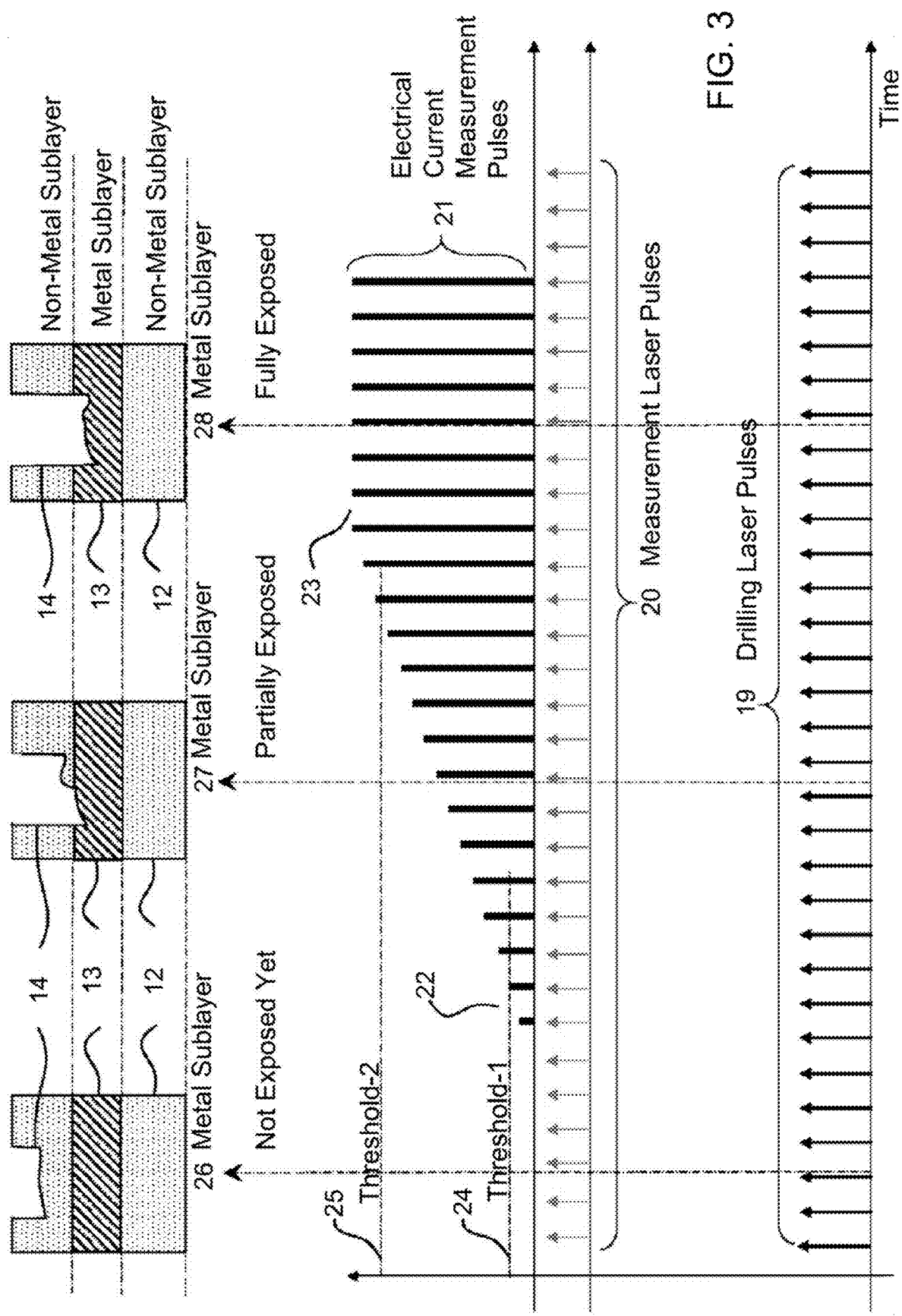
FIG. 3 illustrates the drilling process in accordance with some embodiments of the present subject matter at three different phases: (1) before reaching the metal sublayer, (2) during reaching the level of metal sublayer, and, (3) while drilling in the metal sublayer.

The operation of the drilling process over time is now described, and in so doing attention is drawn to FIG. 3. FIG. 3 illustrates the drilling process in accordance with some embodiments of the present subject matter at three different phases: (1) before reaching the metal sublayer, (2) during reaching the level of metal sublayer, and, (3) while drilling in the metal sublayer.

FIG. 3 shows three snapshots of cross section views along the time axis of a drilling process including the timing of drilling laser pulse series, measurement laser pulse series, and monitoring output pulse series, in accordance with some embodiments of the current subject matter.

In some embodiments of the current subject matter, the illumination from the measurement pulse generator 1 is continuous. In such cases, the output of electric current sensor 17 may comprise a continuous slope with steps—where the number of steps depends on the drill laser energy (i.e. a higher drill energy per pulse results in fewer steps) and the step interval matches the drill pulse intervals.

In some embodiments of the current subject matter, the measurement light pulse rate may be 1:N with respect to drill-laser-pulses. This means that there is one measurement pulse per N drill pulses. This may constitute a less accurate measurement system, but requires less power from the measurement pulse generator 1 and results in a lower voltage build-up per pulse in metal trace 14.

In some embodiments of the current subject matter, the measurement light pulse rate may be 1:1 with respect to drill laser pulses. In this case the pulses from measurement pulse generator 1 are synchronized with the pulses from drill pulse generator 2, so that effectively the metal exposure ratio is being checked after each drilling laser pulse.

In some embodiments of the current subject matter, the measurement light pulse rate may be N:1 with respect to drill laser pulses. In such cases, the measurement pulse generator 1 generates N measurement pulses for each pulse from drill pulse generator 2. This may be suitable for cases in which the measurement signal-to-noise is poor and multiple measurements are required in order to lower the noise level by averaging.

In some embodiments of the current subject matter, the measurement light pulses may be at a fixed phase shift in time with respect to drill-laser pulses. In such cases, the measurement pulse generator 1 generates a measurement pulse at a fixed time delay after a pulse from drill pulse generator 2. This may allow debris created by the drill laser pulse to evaporate or disappear before the drilling progress is measured.

In some embodiments of the current subject matter, the measurement light pulses may have a random phase shift in time with respect to the drill laser pulses (i.e. they are out of synchronization). In such cases, the measurement pulse generator 1 generates a measurement pulse without synchronization to the pulse from drill pulse generator 2. This approach might be easier to implement, but may result in more noisy measurement values.

At stage 26 the metal sublayer has not yet emerged. Once the metal sublayer 14 starts emerging 22 drilling parameters (including pulse wavelength, pulse intensity, pulse duration, pulse interval, and pulse shape) may be adjusted so as to prevent damage such as over-thinning or puncture to the underlying metal sublayer 14, while at the same time, maintaining full exposure of metal sublayer 14 without remainders of the upper insulation sublayer 12.1. Threshold 24 (stage 27) of measured electric current pulse amplitude may be used as an early detection level for first signs of metal sublayer emergence. Measured electric current pulse amplitude level exceeding threshold level 25 may be set at a value which corresponds to metal sublayer exposure completion. Upon an event such as reaching threshold 25 (stage 28), control unit 40 may send a 'Stop' indication 38 to a drill pulse generator 2.

In some embodiments of the current subject matter, the control unit 40 may, while drilling a hole, use predefined threshold limits to identify (1) start of exposure of a metal sublayer, (2) completion of exposure of a metal sublayer, (3) start of removal of a metal sublayer, and (4) completion of removal of a metal sublayer.

The electrical current measurement pulse amplitude 21 may in some embodiments be linear with exposure ratio (ER) of metal sublayer 14. The more the metal sublayer is exposed, the more free electrons 18 are released by the photoelectric effect evoked by the measurement light beam 5 as can be seen at stage 27.

In some embodiments of the current subject matter, the control unit 40 may be used to evaluate the 'envelope' of consecutive measurement electric current pulses as indicated by label 21 in FIG. 3. As the metal sublayer is further exposed, the electric current pulse amplitude may rise. The control unit 40 may calculate the gradient of several consecutive electric current pulses and look for cases where the gradient nulls. Such a zero-gradient may indicate that metal sublayer 14 has been fully exposed. Upon such a zero-gradient event, control unit 40 may send a 'Stop' indication 38 to the drilling pulse generator 2. Such envelope gradient analysis can be used as a more accurate indication of full exposure than just a simple threshold level detection. A control unit 40 may combine both threshold level indication and envelope gradient analysis to generate an even more accurate indication of full exposure. It is noted that the teachings of the presently disclosed subject matter are not bound by the particular snapshots of cross section views along the time axis described with reference to FIG. 3. FIG. 3 describes one aspect of the presently disclosed subject matter by way of non-limiting example.

Figure 4:
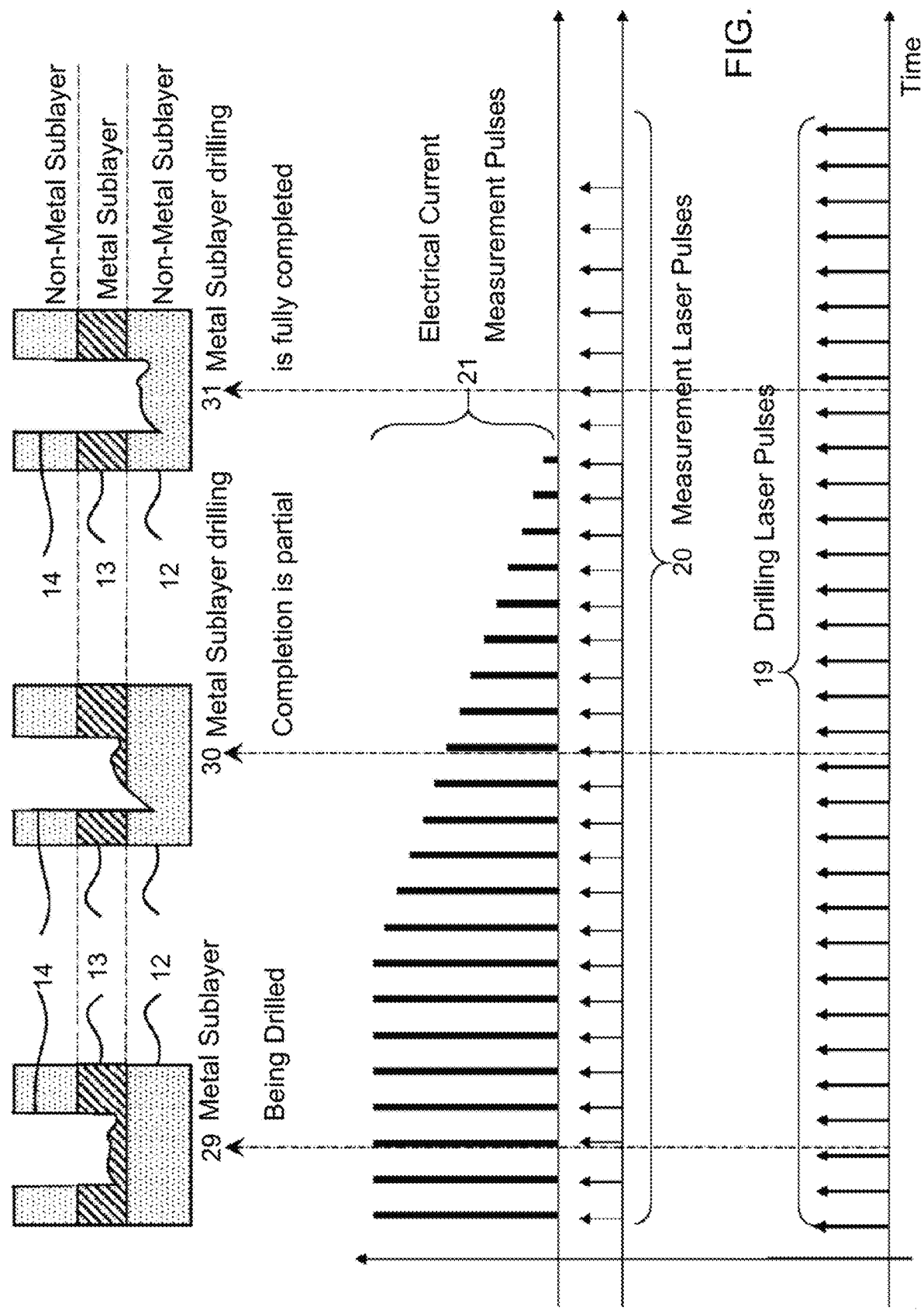
FIG. 4 illustrates a complementary process of the drilling process which is illustrated in FIG. 3, in accordance with some embodiments of the present subject matter, at three different phases: (1) while drilling in the metal sublayer, and removing the metal sublayer so that the metal sublayer is disappearing (2) just after first exposure of the lower non-metal (isolating) sublayer, and, (3) after the lower non-metal (isolating) sublayer has been fully exposed.

FIG. 4 illustrates a complementary process to the drilling process of FIG. 3, in accordance with some embodiments of the current subject matter at three different phases: (1) while drilling in the metal sublayer, and removing the metal sublayer so that the metal sublayer is disappearing (2) just after first exposure of the lower non-metal (isolating) sublayer, and, (3) after the lower non-metal (isolating) sublayer has been fully exposed.

In this case, the goal of the drill process is to drill through the whole metal sublayer and the drilling should stop once the metal sublayer has been fully removed at stage 31. The figure shows drill laser pulses 19, and measurement laser pulses 20 which cause electrical current measurement pulses 21 at the electric current sensor 17. While the drill process is still drilling the metal sublayer at stage 29, a strong electric current pulse may be sensed for every measurement laser pulse. As the metal sublayer disappears, the current weakens (stage 30). Once the metal sublayer has been completely removed at stage 31, there may be very weak residual electric current pulses which are associated with the drilled metal sublayer walls.

It is noted that the teachings of the presently disclosed subject matter are not bound by the particular snapshots of cross section views along the time axis described with reference to FIG. 4. FIG. 4 describes one aspect of the presently disclosed subject matter by way of non-limiting example.

Having now described the drilling system and the process that it executes, we now turn to the process that may be performed by control unit 40. In so doing we turn to FIG. 7, which illustrates an exemplary logical flow carried out by the control unit.

For purposes of example only, we discuss an embodiment in which the emitted radiation is compared with a threshold for the purpose of modifying a drilling control parameter when appropriate.

At block 710, the unit receives a value indicative of the quantity or intensity of free electrons emitted by a metal layer. This value may be the output 37 of electric current sensor 17, or the like.

At block 720, this received value is compared to at least one predefined threshold value. For example, there may be a predefined threshold value that represents the free electron quantity associated with the initial exposure of a metal layer within a drilled hole. Alternatively or additionally, there may be, for example, a predefined threshold value that represents the free electron quantity associated with a metal layer within a drilled hole becoming entirely exposed. If no threshold has been reached, then control returns to block 710 to receive then next periodic value indicative of the quantity or intensity of free electrons.

If the received value is equal to or greater than at least one of the predefined thresholds, then control moves to block 730, and a control operation may be performed as appropriate so as to modify the behavior of the drill. This control operation may comprise, for example, modification of drill pulse wavelength, intensity, duration, interval, pulse shape, and combinations thereof. This control operation may also comprise, for example, terminating the drilling. The specific drill control parameters to be modified and the respective new values to be applied depend, for example, on which threshold(s) have been reached. At this stage, control returns to block 710 so that the next periodic value indicative of the quantity or intensity of free electrons may be received.

The above description of the process implemented by the control unit 40 relates to an embodiment in which the emitted radiation is compared with a threshold for the purpose of modifying a drilling control parameter when appropriate. However it will be understood that the method applies equally in an embodiment where an envelope rather than a threshold is used to determine the state of the hole being drilled.

The above description of the process implemented by the control unit 40 relates to an embodiment in which the emitted radiation is compared with a threshold for the purpose of modifying a drilling control parameter when appropriate. However it will be understood that the method applies equally in the situation described above where the drilling progress is monitored according to the threshold in order to identify the start of exposure of a metal sublayer, completion of exposure of a metal sublayer, start of removal of a metal sublayer, or disappearance of a metal sublayer.

Figure 7:
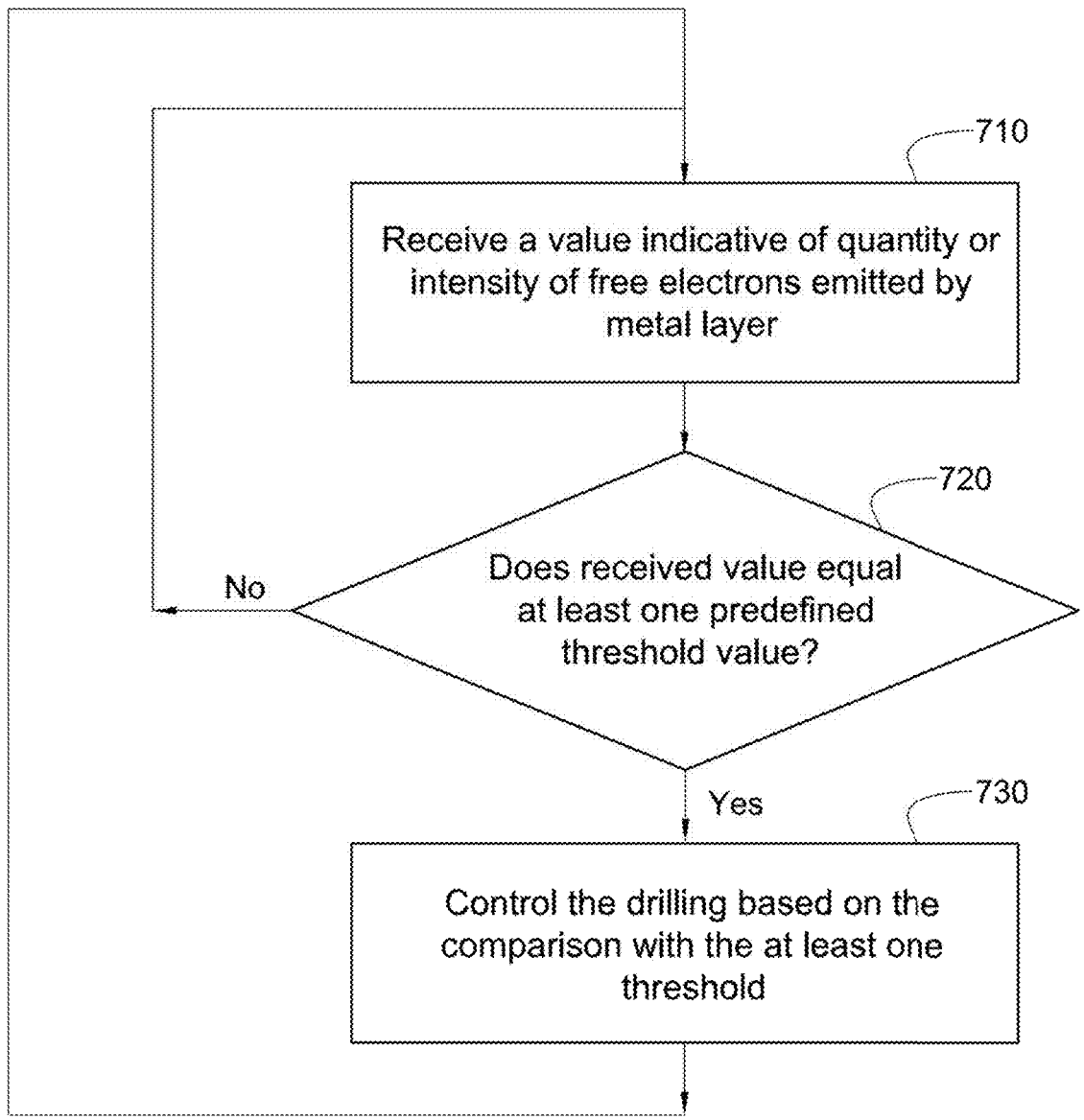
FIG. 7 illustrates a flow chart of the sequence of operations carried out by the control unit of FIG. 2, in accordance with some embodiments of the present subject matter.

It is noted that the teachings of the presently disclosed subject matter are not bound by the flow chart illustrated in FIG. 7, the illustrated operations can occur out of the illustrated order. For example, operation 730 of one iteration and 710 of a different iteration shown in succession can be executed substantially concurrently. It is also noted that whilst the flow chart is described with reference to the control unit described above with reference to FIG. 2. this is by no means binding, and the operations can be performed by elements other than those described herein.

FIG. 6 illustrates why in some embodiments, the measurement electric current pulse amplitude may be linear with the exposure ratio of metal sublayer 14. In FIG. 6 the drilled hole radius is given by $r_h$ and the hole cross section area is given by $A_h$ 42. Similarly, the measurement light beam 5 radius is given by $r_{MB}$. Its cross section at the workpiece is given by $A_{MB}$ 41 where $A_{MB} > A_h$ and $A_h$ fully overlaps with $A_{MB}$. Measurement Beam 5 instantaneous light intensity is given by $LI_{MB}(t)$. The free electrons Collection Efficiency (CE) depends on the voltage offset 16 between workpiece 12 and collecting frame 11. Very high voltage offset 16 results with CE approaching value 1. Otherwise, as voltage difference between anode 7 to drilled metal trace 14 potential approaches zero, CE, in turn, approaches 0.

Given the above, the measured electric current pulse amplitude may be set by equation 2:

$$I(t) = \frac{r_h^2}{r_{MB}^2} \cdot ER \cdot q_e \cdot LI_{MB}(t) \cdot CE(V) \quad \text{Eq. 2}$$

For a given hole, a drilling system 'knows' the hole radius $r_h$. It also 'knows' the measurement light beam cross section radius, $r_{MB}$. It controls the $LI_{MB}$ (Light Intensity of measurement beam 5). Voltage offset 16 is also set by the system. All this leaves Exposure-Ratio (ER) as the only variable that sets the electric current amplitude.

In that sense, in these embodiments, the measured electric current amplitude is fully linear with Exposure-Ratio (ER).

Moreover, the only variable that may vary with time within a measurement period is Measurement Beam Light-Intensity. The electric current will follow the Measurement Beam Light Intensity profile in time with (1) linear proportion to ER and (2) some delay in time due to flight time of free electrons and response time of electric circuit. Eq. 2 can be reformulated as:

$$I(t) = K \cdot ER \cdot LI_{MB}(t) \quad \text{Eq. 3}$$

As mentioned above, it is possible that free electrons 18 are highly scattered in various directions which are not all perpendicular to the workpiece surface. In some embodiments, in order to collect widely spread electrons anode 7 voltage must be high enough to create an electric field strong enough to exert sufficient acceleration over the free electrons 18 so that eventually free electrons 18 reach anode 7. If anode voltage is not high enough, some of the free electrons 18 will not reach anode 7 and will continue in free space. So a higher anode voltage 9 results in a higher collection efficiency value approaching a value of 1. However, in some examples, even a high anode voltage may become not high enough later in the process. This may translate to lower collection efficiency. Such phenomena may be seen, for example, in cases where the metal sublayer 14 being drilled is not grounded, or, in other words, is electrically floating. In these cases, each measurement light pulse may reduce the amount of electrons in metal trace 14 which violates the electrical balance in that metal. The more pulses, the more positive the metal trace 14 becomes. This positive charge creates an electric field which opposes anode electric field. It is possible that at a certain point in time, metal trace 14 induced electric field may even overcome the anode electric field thus resulting in a very low collection efficiency value approaching zero. Such conditions may violate measurement linearity and bias any analysis of the Control Unit 40. Thus, it may be desirable to design the system in such a way that measurement light pulses are short in time and low in amplitude (i.e. low in light intensity). This in turn, may make the electric current measurement process more challenging since the electric current pulses will be also very short in time and low in amplitude (i.e. low in intensity).

The metal trace 14 voltage step per measurement light pulse depends on the metal sublayer trace capacitance according to Q=C V, where Q is the amount of negative electric discharge per measurement light pulse, C is the metal trace 14 capacitance, and V being the voltage step induced in metal trace 14 per measurement light pulse.

Note that control unit 40 may be configured with the capacitance of metal trace 14 which is being drilled and thus may compute the potential increment induced in metal trace 14 by each measurement light pulse.

As mentioned, each measurement light pulse induces an incremental voltage increase at metal trace 14. Drilling several holes at different locations in the same metal trace 14 will have an accumulative effect of metal trace voltage build up with each additional hole. Control unit 40 may be configured with the number of holes that should be made in each specific metal trace 14 to enable it to keep voltage offset 16 sufficiently high during the entire workpiece drilling process even if more than one hole is being drilled in the same metal sublayer trace 14.

In order to overcome the mentioned above metal trace 14 voltage buildup, control unit 40 may control the value of voltage offset 16 to be high enough so as to overcome all factors which contribute to voltage buildup in metal trace 14, such as the drilling of several holes in the same metal trace or the applying of several measurement light pulses per individual hole. Control Unit 40 may perform the control of the voltage offset 16 in accordance with (1) the metal trace 14 capacitance, (2) measurement light intensity, and, (3) measurement light pulse duration.

In an alternative simpler scenario, the drilled metal sublayer is electrically grounded such as metal trace sublayer 15. In such cases there is no voltage buildup in metal trace 15 and metal trace 15 capacitance can be considered as infinity.

The 'quantum efficiency' of the photoelectric process may less than 1 i.e. it may be the case that not every photon with sufficiently high energy actually results in a free electron. Quantum efficiency of less than 1 may reduce the effectiveness of the process—however, the reduction in the quantity of free electrons due to imperfect quantum efficiency may be overcome by increasing the light intensity by an inverse proportion. In this case, the LI(t) formula may be adjusted accordingly.

FIG. 6 describes one aspect of the presently disclosed subject matter in an informative manner only. It will be understood that that the teachings of the presently disclosed subject matter are not bound by the analysis described with reference to FIG. 6.

Figure 5:
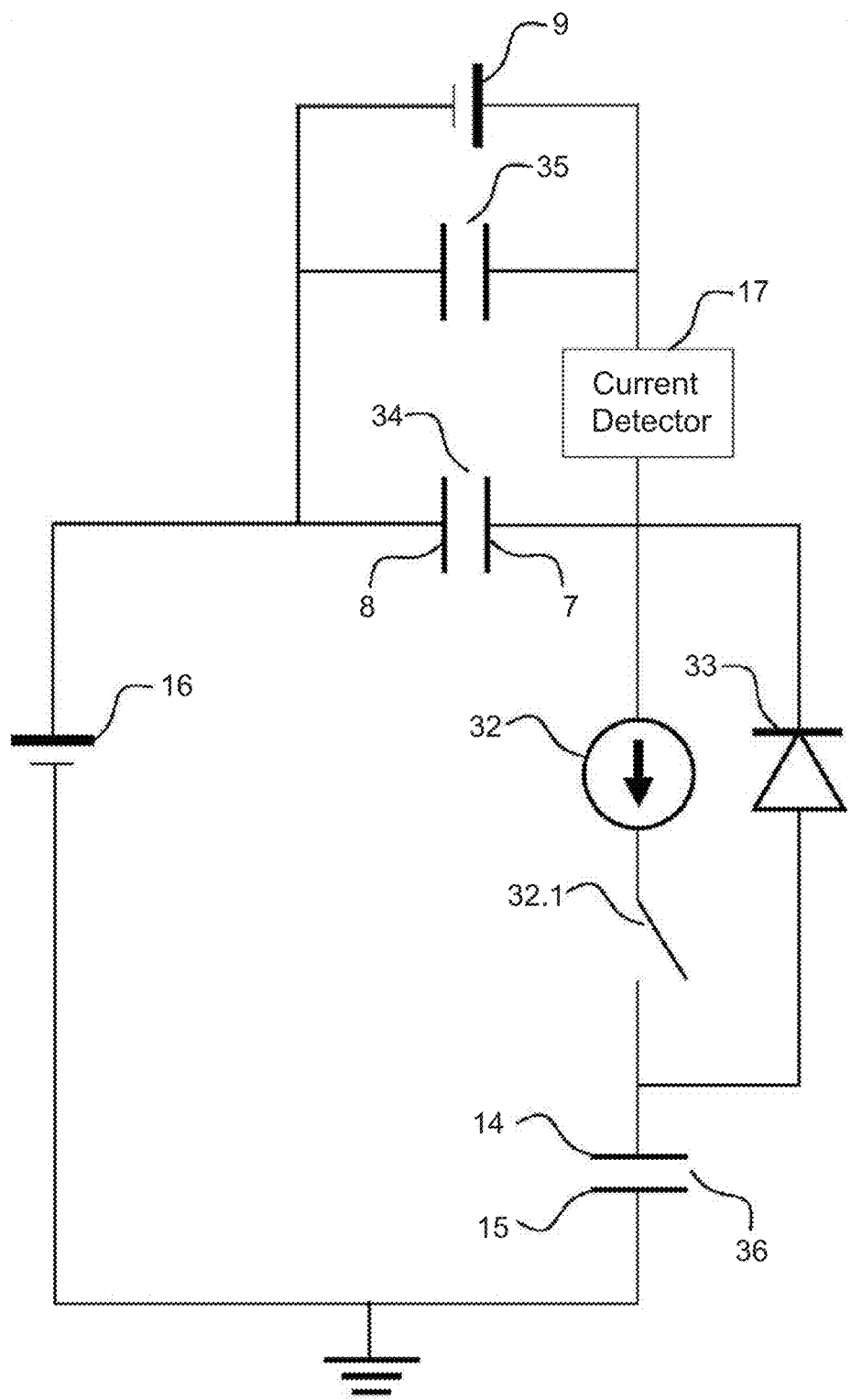

Since some embodiments of the subject matter involve flow of electrically charged particles it is useful to analyze an equivalent electric circuit of the subject in matter. FIG. 5 depicts, for purposes of enhanced understanding only, a schematic model of the elements involved, in accordance with some embodiments. The drilled metal sublayer trace 14 acts as a capacitor. It collects electric charge and, as a consequence, builds voltage. Its capacitance depends on the length, width, and height of metal trace 14 but more importantly, on the gap between the upper surface and lower surface of metal trace 14 to the nearest grounded metal plane sublayer 15. The dielectric material 12.1 in such gap has additional impact on the metal trace 14 capacitance. Anode 7 and cathode 8 create an electric field to capture free electrons 18. This electric field is controlled by anode voltage source 9. The collecting frame 34 is electrically offset by offset voltage source 16 with respect to the workpiece. Each measurement light pulse 20 is represented by a current source 32 and an electric switch 32.1. Each measurement pulse creates a voltage buildup in metal trace 14. Once the metal trace voltage exceeds a certain level, any measurement light pulse will no longer consume electric charge from metal trace 14 or from its representation capacitor 36. This effect is denoted by diode 33 which shorts any further current pulse back without any effect on the circuit. An optional coupling capacitor 35 is placed in adjacency to anode 7 to improve SNR of the measured electrical signal. Such configuration lowers dependency on parasitic resistive paths or any other parasitic capacitance. Lastly, electric current sensor 17 is placed in adjacency to anode 7 to capture any electric current flowing to anode 7 due to free electrons 18 hitting anode 7.

FIG. 5 describes one aspect of the presently disclosed subject matter in an informative manner only. It will be understood that that the teachings of the presently disclosed subject matter are not bound by the schematic model described with reference to FIG. 5.

Another or alternative use for the subject matter may be to identify a specific metal material among several metal materials buried inside a multilayered workpiece. Each metal material has its specific work-function. Even same metal material may have various work-functions energies depending on the crystal structure of such metal. By adjusting the measurement laser wavelength, a specific structure or a specific metal substance may be detected.

Some embodiments of the presently disclosed subject matter can be configured for use in an open-air environment. Some of these embodiments can collect and utilize charged molecules that result from mid-air collisions between emitted electrons and molecules such as $O_2$, $CO_2$, or $H2_0$. Some of these embodiments are described hereinbelow, with reference to FIGS. 8-12.

Figure 8:
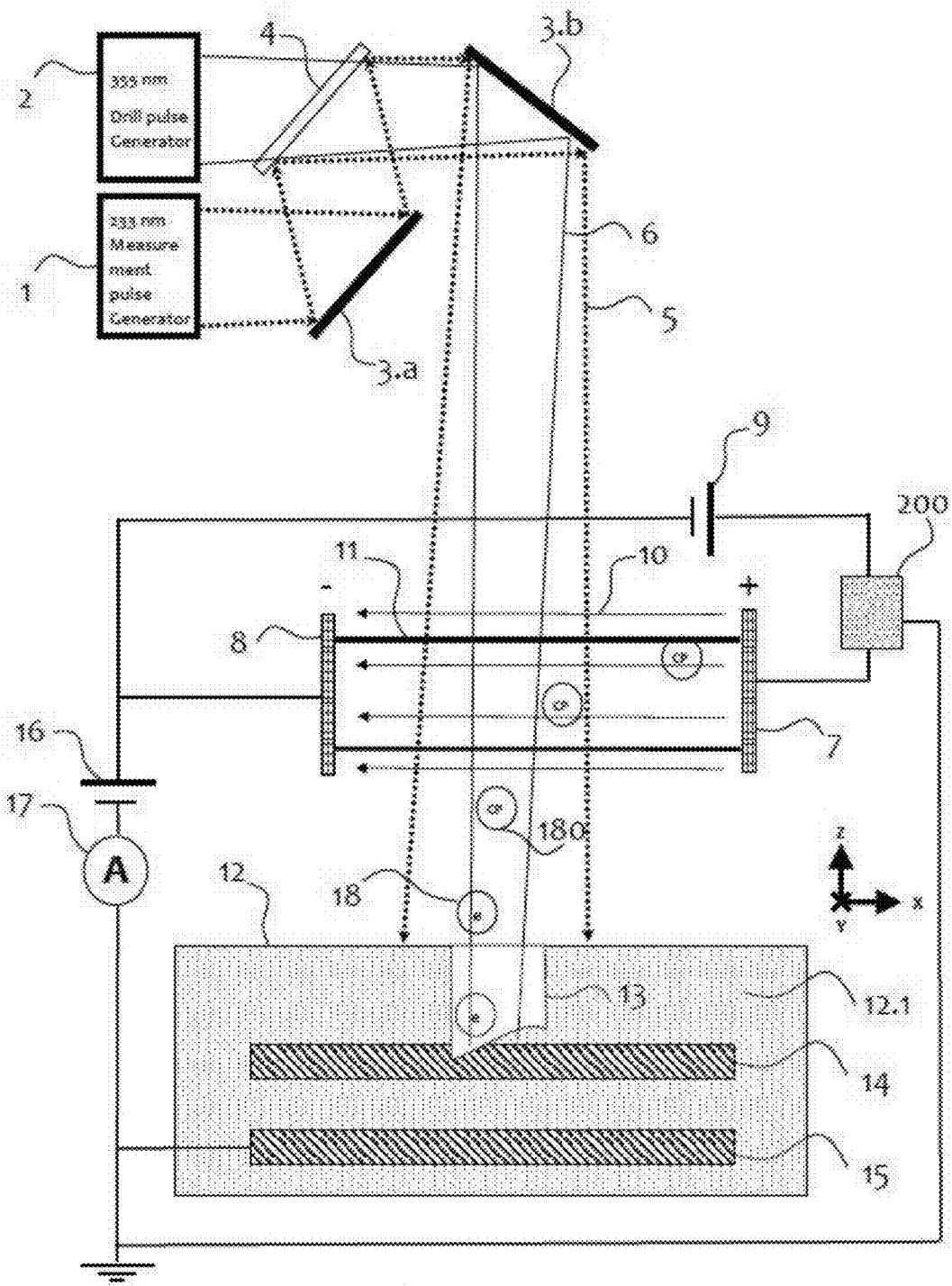
FIG. 8 illustrates a cross-sectional front view of a laser drilling setup configured for collection of charged particles in open air, in accordance with some embodiments of the present subject matter.

Attention is now directed to FIG. 8, which illustrates a cross-sectional front view of a laser drilling setup configured for collection and utilization of charged molecules in open air, in accordance with some embodiments of the present subject matter.

FIG. 8 is similar to FIG. 1. The system of FIG. 8 shows charged molecules 180 rising from the PCB 12.1, and includes resettable electric charge sensor 200, which will be described in detail below. Electric charge sensor 200 can be, for example, operably connected to anode 7, voltage 9, and ground 20.

It is noted that the teachings of the presently disclosed subject matter are not bound by the laser drilling system described with reference to FIG. 8. Equivalent and/or modified functionality can be consolidated or divided in another manner and can be implemented in an appropriate manner which includes additional and/or combined and/or replaced elements.

Figure 9:
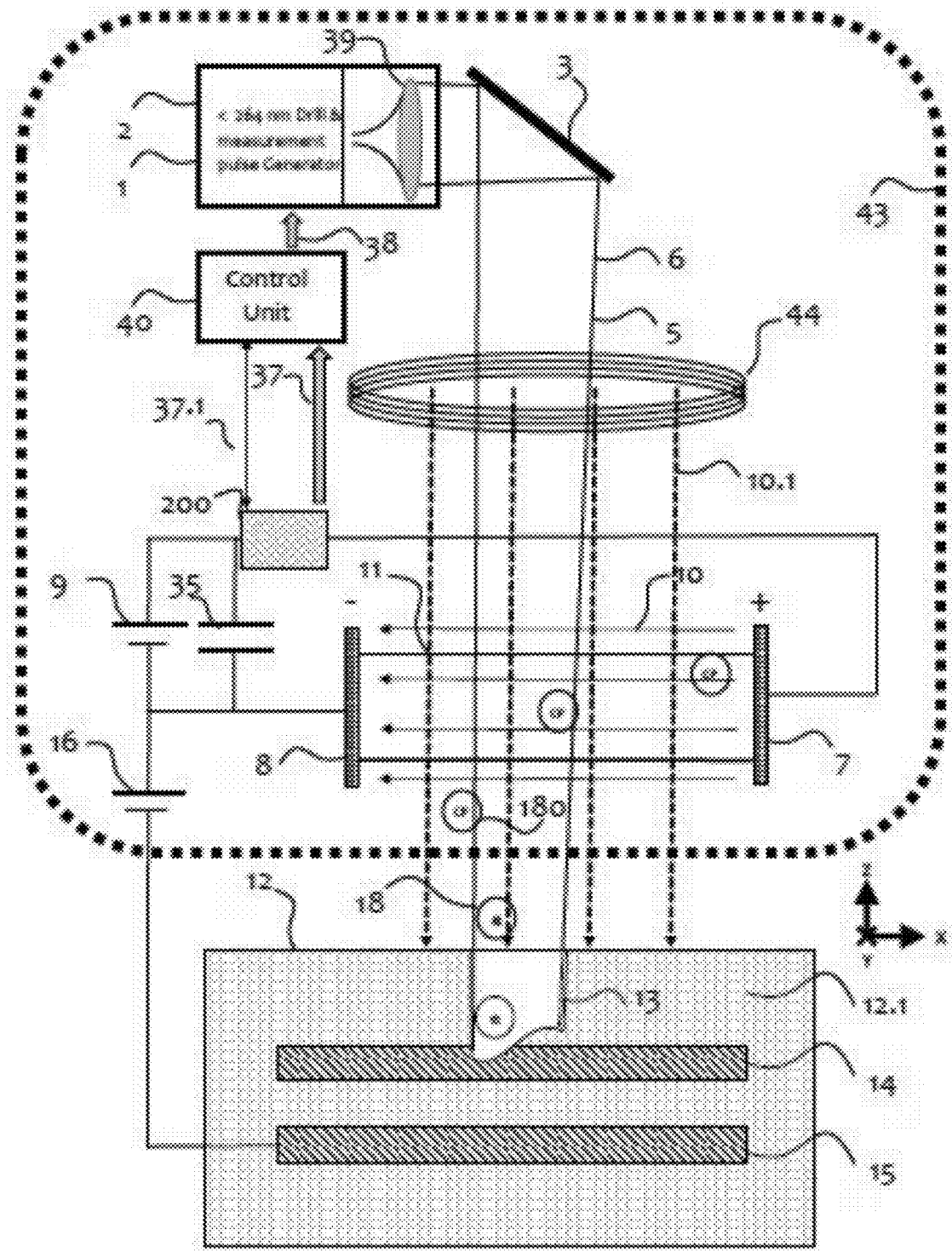
FIG. 9 illustrates another cross-sectional front view of an alternative embodiment of a drilling setup configured for collection of charged particles in open air, including a control unit for adjustment of drilling parameters, in accordance with some embodiments of the present subject matter.

FIG. 9 is similar to FIG. 2, and illustrates another cross-sectional front view of an alternative embodiment of a drilling setup configured for collection of charged particles in open air, including a control unit for adjustment of drilling parameters, in accordance with some embodiments of the present subject matter. Again charged molecules 180 are shown, and in this system, electric charge sensor 200 can be operably connected to control unit 40 via digital control 37.1 (in addition to anode 7, voltage 9, and ground 20). As electric charge sensor 200 can measure the charges of molecules received at the anode the electric current sensor 17 can be absent from the system of FIG. 9.

Compared to electrons, charged molecules 180 have greater and varied mass. The direction and velocity of charged molecules in 3D open-air space is also highly varied, which can affect the timing of charged molecule arrival at the anode. Moreover, charged molecules other than the molecules resultant from emitted electrons can be moving in the airspace of the system—for example: charged molecules resulting from interaction in air with the measurement pulse or with the drill pulse. In some embodiments of the presently disclosed subject matter, structures and methods for the collection and utilization of the charged molecules 180 can address, for example, these and other challenges.

It is noted that the teachings of the presently disclosed subject matter are not bound by the laser drilling system described with reference to FIG. 9. Equivalent and/or modified functionality can be consolidated or divided in another manner and can be implemented in an appropriate manner which includes additional and/or combined and/or replaced elements.

Figure 10:
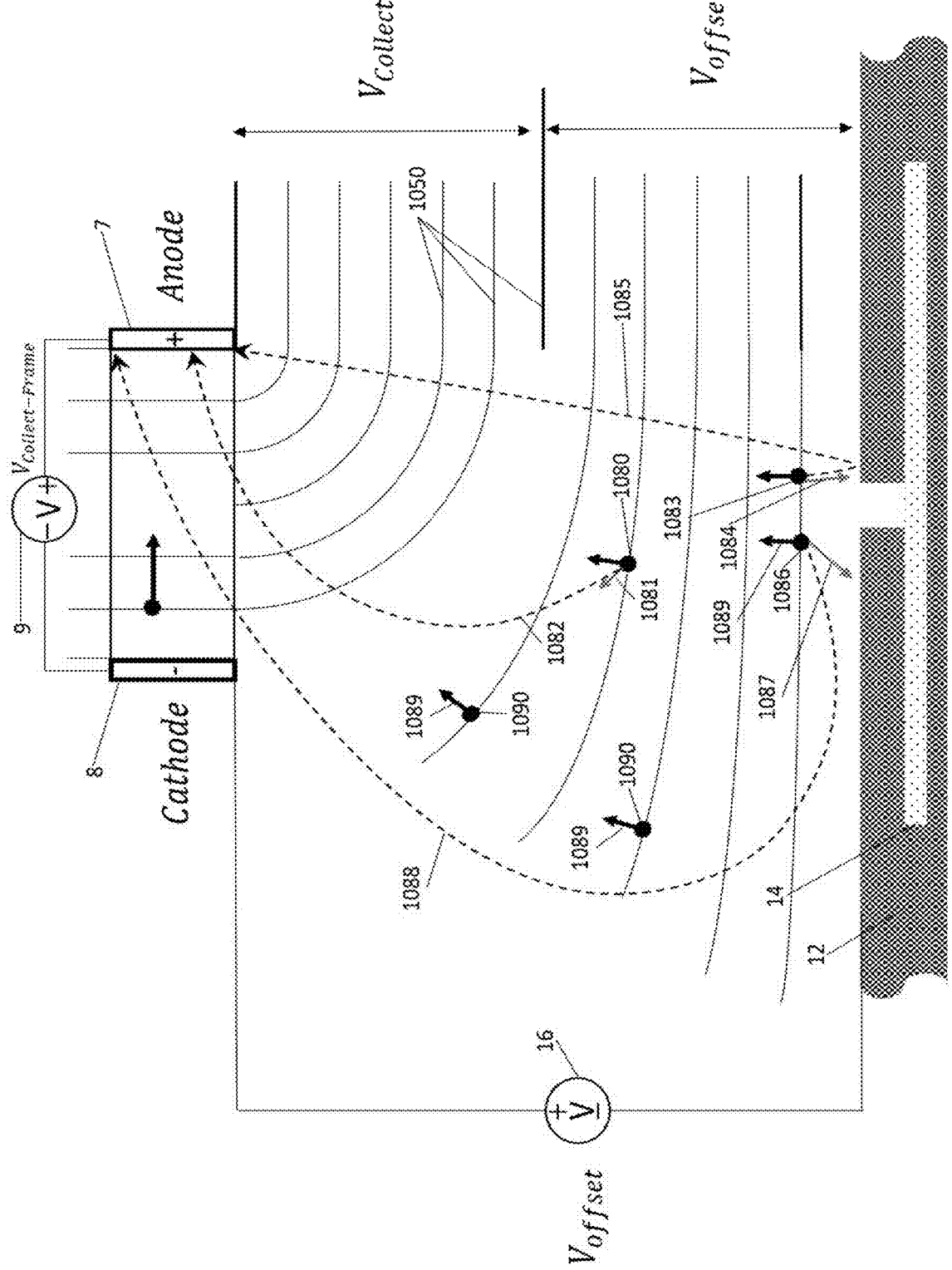
FIG. 10 illustrates an exemplary potential map between an anode, cathode, and workpiece and the effect on charged molecules, according to some embodiments of the presently disclosed subject matter.

Attention is directed to FIG. 10, which illustrates an exemplary potential map between an anode 7, cathode 8, and workpiece (for example: printed circuit board) 12 and an exemplary resulting effect on charged molecules, according to some embodiments of the presently disclosed subject matter. An electric field is the gradient of such a potential map. There can exist equipotential regions 1050 between the anode 7 and the metal layer 14.

It is noted that free electrons released in open air by the metal layer 14 (in response to a measurement pulse) interact with air molecules (usually within a distance of 1 mm or less from the metal layer 14). The molecules can be, for example, gaseous $O_2$ (which can constitute ~20% of the air), gaseous $CO_2$ (1%), and $H_2O$ vapor (quantity depends on air humidity). The velocity of these molecules before (and after) the interaction with a free electron can depend, for example, on air temperature. For example, at room temperature (298 K), a gaseous $O_2$ molecule has an average velocity of 482 m/s. The direction of movement of a molecule in 3-D space can be effectively random.

There can be molecules 1090 which (following collision with an emitted electron) have zero velocity. There is a direction of electric force 1089 associated with each such molecule. Each such direction results from the voltage and the location (relative to the molecule) of anode 7.

The electric field intensity and direction at a particular location can be calculated, according to methods of electric potential maps. The Force (in Newton) exerted on a molecule can be calculated, for example, according to the formula: $F=E*q$, where 'q' denotes the molecule's charge. Thus the acceleration of, for example, molecules 1090 can be calculated, for example, according to Newton's second law: $F=m*a$, where m denotes the mass of the molecule. In this case, the direction of acceleration 'a' is aligned with the electric field direction 1089.

Molecule 1086 has velocity in direction 1087 i.e. it is moving away from anode 7. The force (and acceleration) direction at the time of interaction with a free electron is indicated by 1089. Dashed line 1088 indicates an exemplary path of such a molecule toward the anode.

Molecule 1083, has velocity in direction 1084. The force (and acceleration) direction at the time of interaction with a free electron is indicated by 1089. Dashed line 1085 indicates an exemplary path of such a molecule toward the anode.

It is noted that each molecule has, for example, a different acceleration according to its mass. Moreover, each molecule follows, for example, a different path from the moment of interaction with an emitted free electron until it arrives (or fails to arrive) at the anode 7. As a result, each molecule will arrive at different time (if at all) at the anode 7.

By way of non-limiting example, in a case of an anode 7 with voltage 200V located 6 cm above the hole in workpiece 12, a gaseous $O_2$ molecule with a velocity directed exactly in the opposite direction of the anode 7 can have an acceleration of 1E10 m/Sec^2. After 50 ns, the molecule can reach a complete stop and after roughly an additional 3.5 uSec can reach the anode. It is noted that in most cases the molecule will arrive sooner than in this example, each molecule arriving at a different time depending on its mass and velocity (magnitude and direction).

It is noted that random molecular collisions can occur in open air and that charged molecules resulting from such collisions can arrive at the anode 7 during the collection of the charged molecules resulting from the emitted electrons. In some embodiments of the presently disclosed subject matter, the drilling system does not distinguish such random charged molecules, and these random molecules can contribute a small inaccuracy to the measurement of the exposed metal.

The location of anode 7, the distance of anode 7 from the drilled hole in workpiece 12, and the voltage level of anode 7 can all affect the intensity and directional properties of the electric field. If the spread of all possible paths is too large, it is possible that not all the molecules will be captured.

In some embodiments of the presently disclosed subject matter, the systems of, for example, FIGS. 8-9 are arranged to collect, for example, certain charged molecules in the open air. The set of such molecules that a particular system is arranged to collect are hereforward termed "tracked molecules". In some embodiments of the presently disclosed subject matter, the tracked molecules of the system can include, for example: $O_2$, $CO_2$, and/or $H_2O$.

In some embodiments of the presently disclosed subject matter, the anode 7 dimensions, position, and voltage are arranged according to the union area of all possible paths of all tracked molecules (i.e. greatest mass and least mass), with all possible initial molecule directions (e.g. toward the anode 7, away from the anode 7 etc.), and all velocities (for example, according to a range of air temperature and humidity values).

In some embodiments of the presently disclosed subject matter, the anode 7 dimensions, position, and voltage are arranged according to the subset of all possible paths of all tracked molecules. In such embodiments, molecules might be more likely to escape collection by the anode 7.

In some embodiments of the presently disclosed subject matter, the anode 7 captures all (within some margin of error e.g. 1%) of the molecules which resulted from interactions with the free electrons emitted as a result of the measurement laser burst. In some embodiments of the presently disclosed subject matter, the anode 7 captures a percentage (for example: 90% or 80%—within some margin of error e.g. 1%) of the molecules which resulted from interactions with the free electrons emitted as a result of the measurement laser burst. The percentage of the molecules which resulted from interactions with the free electrons emitted as a result of the measurement laser burst which are collected by the anode 7 in a particular embodiment is hereforward termed the "collection efficiency".

Figure 11:
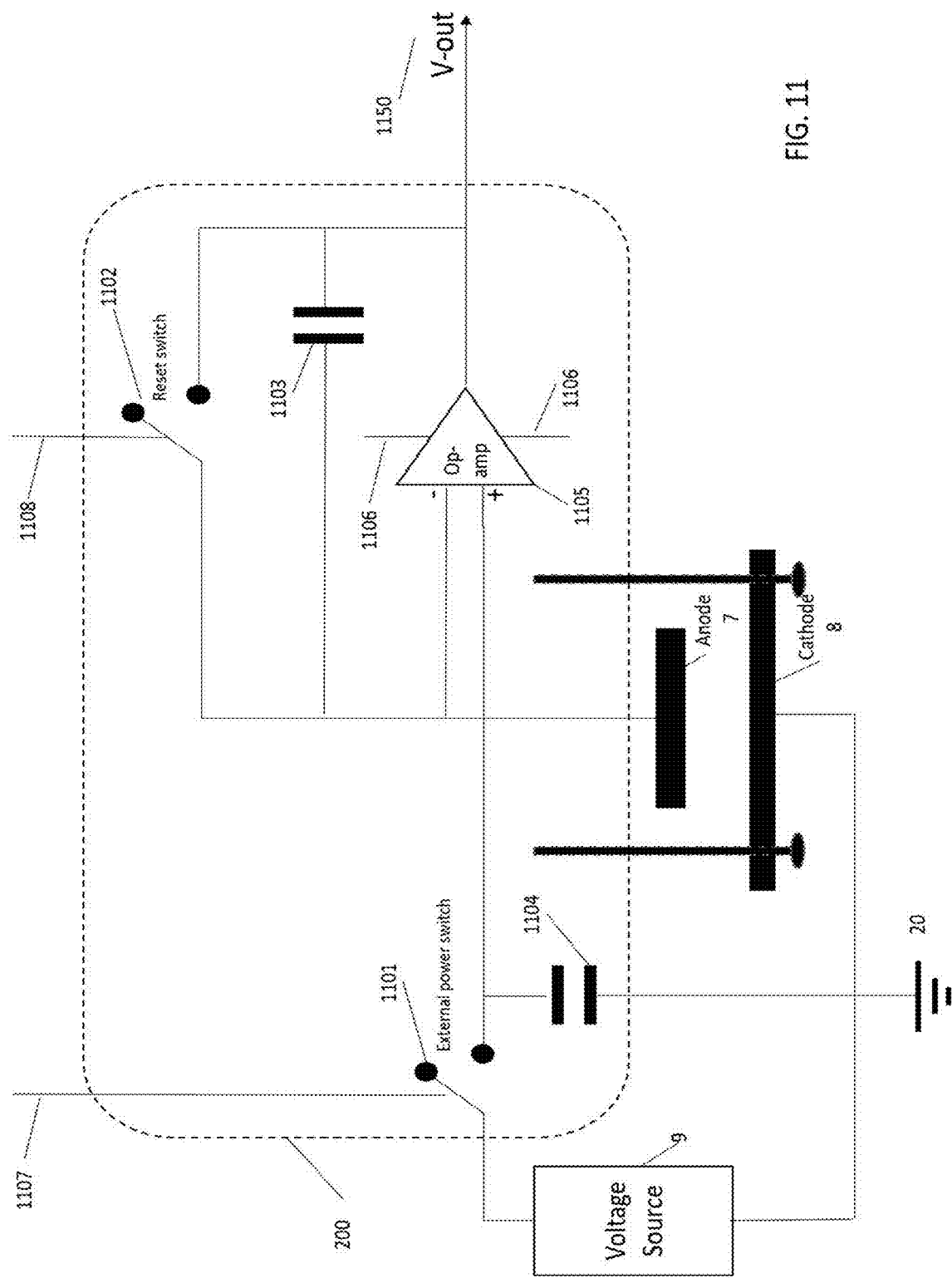
FIG. 11 illustrates an exemplary resettable electric charge sensor for use in collecting charged molecules, according to some embodiments of the presently disclosed subject matter.

Attention is drawn to FIG. 11 which illustrates exemplary resettable electric charge sensor 200 for use in collecting charged molecules 180, according to some embodiments of the presently disclosed subject matter.

The sensor 200 can have external connections, including, for example:

Connection to external high voltage source 9
Connection to ground 20
Anode 7
Digital control signal 1107 for external power switch 1101
Digital control signal 1108 for reset switch 1102
V-Out output signal 1150

External power switch 1101 can be an electrically controlled switch controlled by control unit 40 via digital control signal 1107. In some embodiments of the presently disclosed subject matter, when the external power switch 1101 is in "open" (circuit broken) state, external high voltage source 9 is disconnected from the circuit. When the external power switch 1101 is in "closed" state, the external high voltage source 9 is reconnected.

The external power switch 1101 can enable, for example, the control unit 40 to, for example, disconnect the external high voltage source 9 prior to measurement of charged molecules 180—so as to eliminate the noise of the external high voltage source 9 for the duration of the measurement—and then, for example, to reconnect it afterward.

Powering capacitor 1104 can be, for example, an ordinary capacitor with suitable capacitance. The powering capacitor 1104 can, for example, power the sensor during periods in which, for example, the external high voltage source 9 is disconnected (for example, due to external power switch 1101 being open). In this sense, the powering capacitor 1104 can be regarded as "rechargeable noiseless battery". In some embodiments of the presently disclosed subject matter, the capacitance of powering capacitor 1104 can be, for example, at least 1000× larger than the capacitance of anode 7—to ensure that powering capacitor 1104 is not depleted during a period of measurement.

It is noted that the sensor 200 can be electrically floating (i.e. not grounded) according to the anode 7 voltage. All voltage measurement can be done relative to the voltages of anode 7 and powering capacitor 1104. More specifically, power supply 1106 of the Op-Amp 1105 can also be adjusted according to these voltage levels (otherwise Op-Amp 1105 might saturate or burn).

Reset switch 1102 can be an electrically controllable switch controlled by control unit 40 via digital control signal 1108. When reset switch 1102 is in closed state, the feedback gain capacitor 1103 is bypassed and consequently the sensor is—for example—in reset (i.e. non-charge collecting) state. In this circumstance, the feedback gain capacitor 1103 is depleted i.e. its voltage is zero. When reset switch 1102 is in open state, feedback gain capacitor 1103 is no longer bypassed, and it can collect charge from charged molecules received at the anode 7—so that the sensor can be in active state.

Op-amp 1106 can be, for example, a Direct Current (DC)-coupled high-gain electronic voltage operational amplifier with a differential input and a single-ended output.

When external power switch 1101 is in closed (i.e. circuit active) state, the voltage of powering capacitor 1104 for example matches the voltage of the external voltage source 9. The voltage of the positive input port 1105 of the Op-Amp 1106 also for example matches the voltage of the external voltage source 9. The Op-Amp 1106 output is connected in feedback mode to its negative input, thus—for example—it pushes/pulls current through its output port to—for example—render the voltage on its negative input port exactly equal to the voltage on its positive port. In this circumstance, when reset switch 1102 is also in closed (i.e. circuit active) state, there is—for example—no flow of current to feedback gain capacitor 1103—and thus there is—for example—no voltage buildup in feedback gain capacitor 1103. As a consequence, the voltage of anode 7 voltage—for example—matches the voltage of powering capacitor 1104 (which in turn matches the voltage of external power source 9). Also as a consequence, the voltage of feedback gain capacitor 1103 is—for example—zero. The system is at then at equilibrium: all currents are—for example—zero, except—for example—for leakage current through the Op-Amp 1105 input port.

When external power switch 1101 is in open (i.e. circuit inactive) state (for example: after being opened by the control unit 40 via digital control signal 1107), external voltage source 9 is—for example—disconnected so as to isolate any power noise. In this circumstance the voltage of powering capacitor 1104 settles at—for example—the last voltage of external voltage source 9 (within an uncertainty hereforward termed "switching noise"). In this state, any decline in the voltage of powering capacitor 1104 is—for example—followed by a correction current from Op-Amp 1105 to reduce the anode 7 voltage so as to match the voltage of powering capacitor 1104 (so that the positive input 1105 and negative input of Op-Amp 1106 have the same voltage). In this circumstance, when reset switch 1102 is in closed (i.e. circuit active) state, there is—for example—no flow of current to feedback gain capacitor 1103—and thus there is—for example—no voltage buildup in feedback gain capacitor 1103. However, when reset switch 1102 is in open (i.e. circuit inactive) state (for example: after being opened by the control unit 40 via digital control signals 1108), feedback gain capacitor 1103—for example—integrates any current flowing from Op-Amp 1105 output to anode 7. The current integration causes—for example—voltage buildup in the feedback gain capacitor 1103.

Furthermore, when reset switch 1101 is in open (i.e. circuit inactive) state, the charge sensor is—for example—active and any negatively charged molecules that contact the anode 7 will—for example—reduce the anode voltage by a quantity of—for example—Q/C (where Q is the charge of the molecule e.g. 1.6E-19 and C is the capacitance of the anode 7. The reduction in voltage causes—for example—the Op-Amp 1106 to—for example—output current from its output port to increase the anode 7 voltage to the voltage that it maintained before the negatively charged molecule arrived. The current flows—for example—via feedback gain capacitor 1103.

Thus, by way of non-limiting example, if 1000 negatively charged particles reach anode 7, Op-Amp 1105 sends 1000 positive charges through feedback gain capacitor 1103 and voltage builds in feedback gain capacitor 1103 accordingly.

It is noted that the opening of reset switch 1101 can also result in voltage buildup in feedback gain capacitor 1103 due to switching noise.

V-Out output signal 1150, changes voltage according to—for example—the capacitance of feedback gain capacitor 1103. The voltage of V-Out output signal 1150 at any given time represents—for example—the amount of electric charge accumulated by sensor 200 since—for example—the time that the sensor was activated. The voltage of V-Out output signal 1150 can be a proportion of voltage resulting from full metal exposure of the hole being drilled. More specifically, if V represents the voltage of V-Out output signal 1150 upon complete metal exposure, then 0.5*V can indicate 50% exposure of the metal.

The voltage resulting from full metal exposure of the hole being drilled can be known, for example, through measurement. Alternatively, the voltage resulting from full metal exposure of the hole being drilled can be known, for example, by computation according to, for example: diameter of the hole being driller, measurement laser intensity, measurement laser pulse width, beam diameter at workpiece 12, quantum efficiency of metal 14 being drilled, anode 7 voltage, air temperature, air humidity, anode 7 dimensions, anode 7 distance from workpiece 12, collection efficiency, and capacitance of feedback gain capacitor 1103.

It is noted that if the collection efficiency of the system is less than 100%, then the significance of the V-Out output signal 1150 can vary accordingly. For example, if collection efficiency is 90%, then if V represents the voltage of V-Out output signal 1150 upon complete metal exposure, 0.5*V can indicate 55% exposure of the metal.

The control unit 40 can include, for example, an analog-to-digital (ADC) unit which converts the voltage to a digital representation. The digital representation can be, for example, a representation of the accumulated charge in the sensor. Alternatively, the digital representation can be, for example, a representation of the proportion or amount of metal exposed. An ADC unit can be a component of the control unit 40, or it can be an independent component which receives—for example—V-Out output signal 1150 and provides a digital representation to—for example—the control unit 40. Additional components, communication buses etc. can, for example, be interposed between the sensor 200 and control unit 40.

It is noted that the teachings of the presently disclosed subject matter are not bound by the sensor described with reference to FIG. 11. Equivalent and/or modified functionality can be consolidated or divided in another manner and can be implemented in an appropriate manner which includes additional and/or combined and/or replaced elements.

Figure 12:
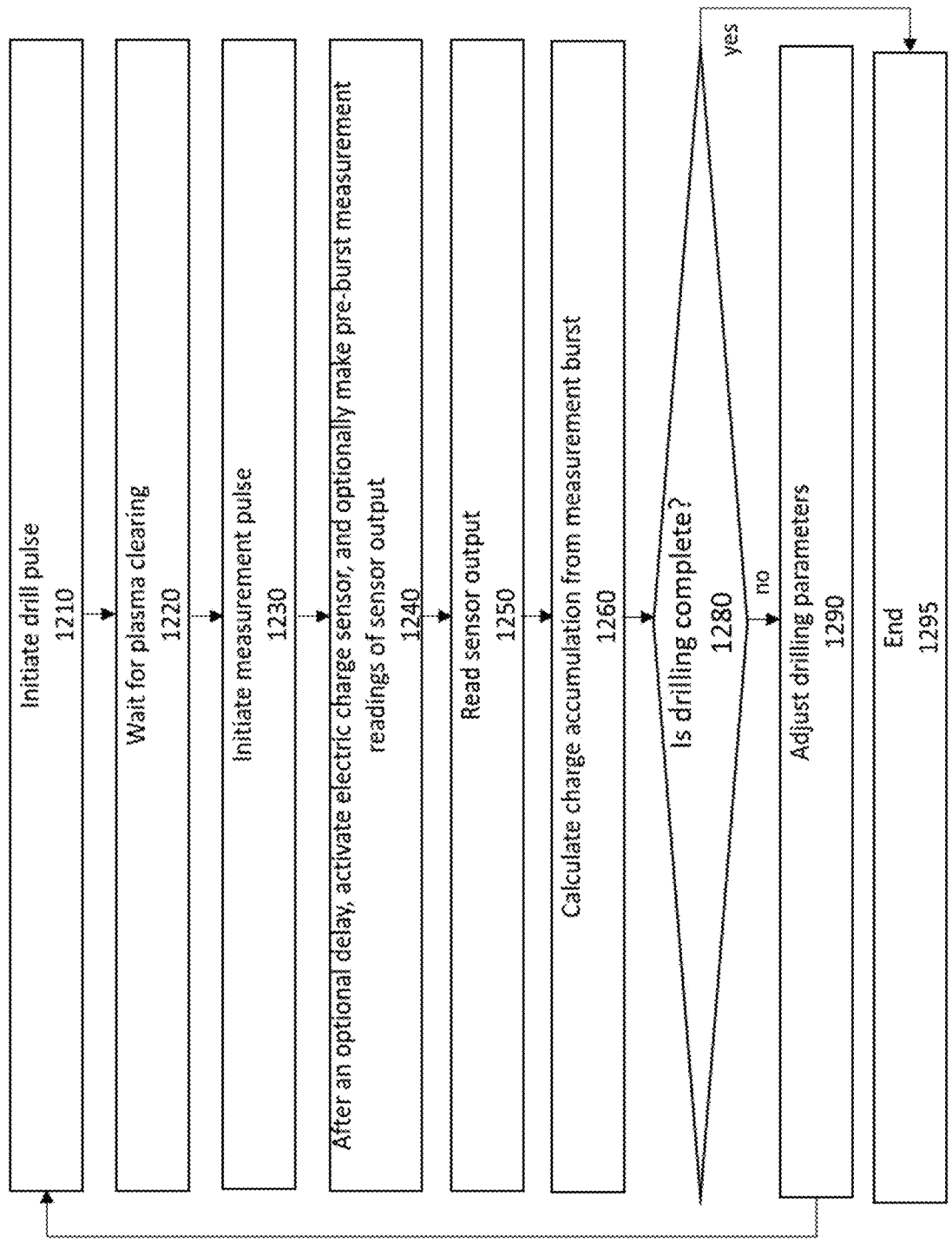
FIG. 12 illustrates a generalized flow diagram of the sequence of operations carried out by the control unit of FIG. 9 according to some embodiments of the presently disclosed subject matter.

Attention is now directed to FIG. 12 which illustrates a generalized flow diagram of an exemplary method for controlling the components of the drilling system, according to some embodiments of the presently disclosed subject matter.

Following the measurement pulse, the free electrons are—for example—emitted by the exposed metal layer. These free electrons interact in open air with—for example—molecules of types that are included in the tracked molecules. The electric field created by the anode 7 causes—for example—at least some of the charged molecules resulting from these interactions to move toward the anode 7 at varying velocities and directions as described above with reference to FIG. 10.

In some embodiments of the presently disclosed subject matter, the drilling system (for example, control unit 40) can compute one or more values indicative of the time anticipated for different molecules of the tracked molecules to reach the anode 7 according to different possible molecule velocities and directions. Such a computed value is hereforward termed a "molecule delay adjustment".

By way of non-limiting example, a "best case" molecule delay adjustment can be computed for a low mass molecule of the tracked molecules (for example: $H_2O$) with high (according to air temperature) velocity moving directly toward anode 7, according to the distance of the anode 7 from the workpiece, and according to the voltage of anode 7.

By way of non-limiting example, a "worst case" molecule delay adjustment can be computed for a high mass molecule of the tracked molecules (for example: $CO_2$) with high (in accordance with air temperature) velocity moving directly away from anode 7.

In some embodiments of the presently disclosed subject matter, in order to capture and measure charged particles deriving from the interactions of emitted electrons with molecules in open air, the drilling system (for example, control unit 40) can activate the electric charge sensor 200 at a start time, and read the V-Out output signal 1150 at a read time—so as to capture at least part of these intended charged particles. In some embodiments of the presently disclosed subject matter, in order to capture and measure these charged particles, the drilling system (for example, control unit 40) can activate the electric charge sensor 200 in response to a start-triggering event, and read the V-Out output signal 1150 in response to a read-triggering event—so as to capture at least part of these intended charged particles In some embodiments of the presently disclosed subject matter, in order to capture and measure charged particles deriving from the interactions of emitted electrons with molecules in open air, the drilling system (for example, control unit 40) can activate the electric charge sensor 200 before the calculated arrival time of these charged molecules at the anode 7 (for example: as indicated by the initiation time (for example: rise time) of the measurement pulse in combination with the best-case molecule delay adjustment), and read the V-Out output signal 1150 after the calculated completion of the arrival of these molecules (for example: as indicated by the cessation time (for example: fall time) of the measurement pulse in combination with the worst-case molecule delay adjustment).

The drilling system (for example, control unit 40) can begin a process of drilling a hole in a workpiece by—for example—initiating (1210) a drill pulse of the drilling laser. In some embodiments of the presently disclosed subject matter, electric charge sensor 200 is in reset state during this operation i.e. sensor 200 is not monitoring for charged particles during the drilling.

The drilling operation can result in plasma above the workpiece 12, the drilling system (for example, control unit 40) can wait a period of time (for example, a system specific period of time determined according to the characteristics of, for example, the drilling laser) to allow the plasma to clear.

Following the wait for clearing of plasma, the drilling system (for example, control unit 40) can initiate (1230) the measurement pulse from the measurement laser. The measurement pulse can have, for example, a single duration that is utilized in each measurement cycle (for example: 1 ns). Alternatively, the measurement pulse can, for example, vary in duration between cycles.

Following the initiation of the measurement pulse, the drilling system (for example, control unit 40) can optionally delay, for example, a calculated period, before—for example—activating (1240) the electric charge sensor 200.

In some embodiments of the presently disclosed subject matter, the drilling system (for example, control unit 40) can compensate for switching noise in the sensor 200. In some of such embodiments, the drilling system (for example, control unit 40) can measure switching noise by reading the V-Out output signal 1150 prior to the calculated arrival times of the charged molecules resulting from the interactions with emitted free electrons. The time required for, for example, controlling switches 1101 and 1102, settling of switching noise, and reading and processing the V-Out output signal 1150 is hereforward termed Switching Noise Assessment Time. In such embodiments, the drilling system (for example, control unit 40) can calculate a delay between the initiation of the measurement pulse and time of sensor activation according to, for example, the formula:

Delay=(Best Case Molecule Delay Adjustment−
Switching Noise Assessment Time)

The drilling system (for example, control unit 40) can activate the electric charge sensor 200 by—for example—opening the reset switch 1102 using the digital control signal 1108.

In some embodiments of the presently disclosed subject matter, the drilling system (for example, control unit 40) can—for example—first open the external power switch 1102 using the digital control signal 1107 so as to reduce the noise of voltage source 9 in the sensor, before opening the reset switch 1102.

After the sensor has been activated, the drilling system (for example, control unit 40) can optionally read the V-Out output signal 1150 and store the value as a switching noise measurement for subsequent use.

After the sensor has been activated, the drilling system (for example, control unit 40) can optionally read the V-Out output signal 1150 one or more times to determine the amount of voltage accumulation in the sensor due to leakage currents. By way of non-limiting example: following the reading of V-Out output signal 1150 and storing the value as a switching noise measurement, the drilling system (for example, control unit 40) can, for example, perform the following steps:

Wait for a period of time (hereforward termed the leakage accumulation delay period)
read the V-Out output signal 1150 another time
determine the difference between this reading
store this difference as the leakage voltage per the leakage accumulation delay period In some embodiments of the presently disclosed subject matter, the drilling system (for example, control unit 40) can optionally determine leakage after the collection of charged particles resulting from collisions from emitted electrons.

The drilling system (for example, control unit 40) can read (1250) sensor output e.g. V-Out output signal 1150. The drilling system (for example, control unit 40) can do this, for example, at a time when all charged molecules resultant interactions from emitted electrons due to the measurement pulse are expected to have been received at the anode 7. In some embodiments of the presently disclosed subject matter, this time can be determined by adding the worst-case molecule delay adjustment to the measurement pulse cessation time.

In some embodiments of the presently disclosed subject matter, the drilling system (for example, control unit 40) can, following the read of the sensor 200 output, reset the sensor 200—so that it can release its accumulated charge and start accumulation again following reactivation. In some embodiments of the presently disclosed subject matter, the drilling system (for example, control unit 40) can, reset the sensor 200 at a different stage—however if the sensor 200—for example—is allowed to accumulate charge past its saturation point, readings from V-Out output signal 1150 will—for example—no longer be useful.

In some embodiments of the presently disclosed subject matter, the drilling system (for example, control unit 40) can, following the read of the sensor 200 output, switch on the external power of the sensor 200—to enable recharging powering capacitor 1104. In some embodiments of the presently disclosed subject matter, the drilling system (for example, control unit 40) can, switch on the external power of the sensor 200 at a different stage—however if powering capacitor 1104—for example—is allowed to deplete its power, readings from V-Out output signal 1150 will—for example—no longer be useful.

The drilling system (for example, control unit 40) can next calculate (1260) a value indicative of what quantity of the charge accumulation (as read from sensor output) derives from charged molecules 180 resulting from electrons emitted from metal layer 14 in response to the measurement laser burst. In some embodiments of the presently disclosed subject matter, the drilling system (for example, control unit 40) accomplishes this by subtracting the measured switching noise voltage from the final measured voltage—thereby compensating for switching noise. In some embodiments of the presently disclosed subject matter, the drilling system (for example, control unit 40) accomplishes this by subtracting the leakage voltage from the final measured voltage—thereby compensating for leakage current.

The drilling system (for example, control unit 40) can next assess (as described above with reference to FIG. 7 and elsewhere) whether—according to its measurements—the drilling is complete (1280). If not, the drilling system (for example, control unit 40) can adjust (1290) its drilling parameters (as described above with reference to FIG. 7 and elsewhere), and start another drilling (1210) cycle.

It is noted that the teachings of the presently disclosed subject matter are not bound by the flow chart illustrated in FIG. 12, the illustrated operations can occur out of the illustrated order. It is also noted that whilst the flow chart is described with reference to the control unit described above with reference to FIG. 9. this is by no means binding, and the operations can be performed by elements other than those described herein.

FIG. 12 describes some embodiments wherein the drilling system (for example, control unit 40) can utilize information based on the times of initiation and cessation of a measurement pulse and molecule delay adjustments to isolate charge accumulation that is (mostly or exclusively) due to the charged molecules derived from electrons resulting from the measurement pulse.

In some other embodiments, digital signal processing methods can be used in addition to or instead of timing-based methods as described above. By way of non-limiting example, the sensor 200 can—for example—be active for the entire drill pulse cycle (i.e. the drill pulse, plasma clearing, measurement pulse, molecule collection) or even for more than one cycle (subject to sensor 200 saturation considerations). The drilling system (for example, control unit 40) can periodically read V-Out output signal 1150. The series of readings can then be processed as a signal and signal processing methods to monitor different phases of charge increase that can be attributed by to—for example—the drill pulse, the measurement pulse, and also from the interactions with free electrons.

In many cases today, laser drilling is done in workpieces 12 which are ungrounded or poorly grounded. In such cases any charge which is emitted by the metal sublayer 14 which is being drilled during the measurement process increases the electrical potential of the workpiece 12. This accumulated potential may eventually interfere with the measurement of the charged particles 180, and in extreme cases can render the measurement impossible.

Thus, in some embodiments of the presently disclosed subject matter, the system utilizes a measurement laser pulse of sufficiently low energy to ensure that the accumulated charge remains suitably low (as detailed hereinbelow).

By way of non-limiting example: in the case of a metal sublayer trace capacitance of 3.3 pF/inch, a short trace length could be 60 micrometers. Accordingly, trace capacitance would be 7.8 femto Farad (7.8E-15 F). If, for example, 100K electrons are extracted from the metal trace per measurement laser pulse when the metal is fully exposed, the corresponding charge per pulse is 1.6E-14 Coulomb. From the formula $Q=C*V$ it can be derived that the voltage increase resulting from a single measurement pulse of a fully exposed metal hole is ~2 volts. If 5 drill laser pulses are required from the first exposure of the metal until full exposure of the metal and if the metal exposure area increases in a linear manner with each pulse, then the total (integral) metal sublayer voltage buildup during these 5 pulses will be 5 [pulses]*2 [Volts per pulse]/2 (i.e. 5 Volts). Drilling, for example 4 holes in the same trace would accumulate to 4*5=20 [Volts].

In some embodiments of the presently disclosed subject matter, the accumulated voltage in the workpiece 12 can be below 10% of the anode 7 voltage—so as to avoid interfering with molecule collection for the measurement.

Referring, by way of non-limiting example, to the scenario described above, keeping anode 7 voltage at 220V above workpiece 12 voltage can, in some embodiments of the presently disclosed subject matter, guarantee at least 200V effective voltage difference during the drilling of the trace.

In some embodiments of the presently disclosed subject matter, the sensor 200 can have sensitivity equivalent to 1% (or less) of the full burst charge, so as to enable drill control of a particular precision.

Referring, by way of non-limiting example, to the scenario described above: with 100K electrons emitted per-burst from fully exposed metal 14, the sensor 200 would be required to detect an equivalent charge of 1K electrons (0.16 femto-Coulomb).

In accordance with one aspect of the presently disclosed subject matter, there is provided a computer program product comprising a computer useable medium having computer readable program code embodied therein, said computer program product comprising the method described above, with reference to FIG. 12.

It is to be understood that the subject matter is not limited in its application to the details set forth in the description contained herein or illustrated in the drawings. The subject matter is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the current subject matter.

It will also be understood that the system according to the subject matter, or any part thereof may be, at least partly, a suitably programmed computer. Likewise, the subject contemplates a computer program being readable by a computer for executing the method of the subject matter or any part thereof. The subject matter further contemplates a machine-readable memory tangibly embodying a program of instructions executable by the machine for executing the method of the subject matter, or any part thereof.

Those skilled in the art will readily appreciate that various modifications and changes can be applied to the embodiments of the subject matter as hereinbefore described without departing from its scope, defined in and by the appended claims.

The invention claimed is:

1. A system comprising:
   a source of electromagnetic radiation configured to transmit a measurement pulse in open air to a workpiece, the pulse having at least one wavelength with higher energy than a work-function of a metal layer of the workpiece, and giving rise to electrically charged molecules deriving from interactions of air molecules with free electrons that were emitted by the metal layer in the workpiece, the quantity of free electrons emitted being dependent on the extent of exposure of the metal of the workpiece;
   an anode;
   a resettable electric charge sensor (ECS), operably connected to the anode the ECS being configured to, subsequent to an ECS activation, accumulate electric charge derivative of charged molecules received at the anode;
   a control unit, operably connected to the ECS, and configured to:
   a) activate the ECS in accordance with:
      a time of initiation of a measurement pulse, and
      a first molecule delay adjustment;
   b) receive, from the ECS, at least one value indicative of an amount of charge accumulated since ECS activation, the receiving being in accordance with:
      a time of cessation of the measurement pulse, and
      a second molecule delay adjustment,
   c) determine, from the at least one value, a second value indicative of a quantity of charged molecules received at the anode that were derivative of electrons emitted by the workpiece responsive to a measurement pulse;
   d) perform at least one of:
      i) identifying at least one of: exposure or disappearance of the metal layer in accordance with, at least, the second value, and
      ii) controlling drilling in accordance with, at least, the second value.

2. The system of claim 1, wherein at least one value indicative of a quantity of at least part of the charge collected comprises a voltage.

3. The system of claim 1, wherein each molecule delay adjustment is determined in accordance with at least one of:
   one or more tracked molecule types,
   an electric field potential of the anode, and
   a temperature of the open air.

4. The system of claim 1, wherein the second value is determined in accordance with a known collection efficiency.

5. The system of claim 1, wherein the ECS is ungrounded, and wherein the second value is determined in accordance with a voltage of the anode.

6. The system of claim 1, wherein the receiving the at least one value comprises:
   periodically receiving value indicative of an amount of charge accumulated since ECS activation, thereby giving rise to a signal; and
   determining the second value from the signal, using signal processing methods.

7. The system of claim 1, wherein determining the second value comprises compensating for switching noise in the at least one value.

8. The system of claim 1, wherein the determining the second value comprises compensating for leakage current in the at least one value.

9. The system of claim 1, wherein the pulse energy of the radiation source is configured so that workpiece potential emerging due to electrons emitted from the metal layer of a given composition over a number of pulses, according to the composition, the pulse energy, and the number of pulses, is no more than 10% of the anode voltage.

10. The system of claim 6, wherein the ECS is configured with sensitivity no larger than 1% of the charge of electrons emerging emitted from the metal layer according to its composition and the pulse energy of the radiation source.

* * * * *